United States Patent
Azoulay et al.

(10) Patent No.: US 12,320,774 B2
(45) Date of Patent: Jun. 3, 2025

(54) MACROCYCLE EMBEDDED ORGANIC ELECTRONIC MATERIALS, COMPOSITES, AND COMPOSITIONS FOR CHEMICAL SENSING

(71) Applicants: UNIVERSITY OF SOUTHERN MISSISSIPPI, Hattiesburg, MS (US); THE TRUSTEES OF INDIANA UNIVERSITY, Bloomington, IN (US)

(72) Inventors: Jason Azoulay, Hattiesburg, MS (US); Joshua Tropp, Hattiesburg, MS (US); Vikash Kaphle, Hattiesburg, MS (US); Anthony Benasco, Hattiesburg, MS (US); Amar Flood, Bloomington, IN (US)

(*) Notice: Subject to any disclaimer, the term of this patent is extended or adjusted under 35 U.S.C. 154(b) by 802 days.

(21) Appl. No.: 17/519,083

(22) Filed: Nov. 4, 2021

(65) Prior Publication Data

US 2022/0326175 A1    Oct. 13, 2022

Related U.S. Application Data

(60) Provisional application No. 63/109,789, filed on Nov. 4, 2020.

(51) Int. Cl.
*G01N 27/414*    (2006.01)
*H10K 10/40*    (2023.01)

(52) U.S. Cl.
CPC ....... *G01N 27/414* (2013.01); *G01N 27/4145* (2013.01); *H10K 10/40* (2023.02)

(58) Field of Classification Search
CPC .............. G01N 27/414; G01N 27/4145–4148
See application file for complete search history.

(56) References Cited

U.S. PATENT DOCUMENTS

| | | |
|---|---|---|
| 4,444,892 A | 4/1984 | Malmros |
| 5,312,762 A | 5/1994 | Guiseppi-Elie |

(Continued)

FOREIGN PATENT DOCUMENTS

| | | |
|---|---|---|
| EP | 2975391 A1 | 1/2016 |
| EP | 2385563 B1 | 11/2016 |

OTHER PUBLICATIONS

Pankow et al., Enhanced Optical Contrast and Switching in Near-Infrared Electrochromic Devices by Optimizing Conjugated Polymer Oligo(Ethylene Glycol) Sidechain Content and Gel Electrolyte Composition, Advanced Functional Materials, vol. 34, Issue 2, 2309428, pp. 1-13 (2023) (Year: 2023).*

(Continued)

*Primary Examiner* — James Lin
*Assistant Examiner* — Vivian A Tran
(74) *Attorney, Agent, or Firm* — Mendelsohn Dunleavy PC; Kevin J. Dunleavy; Kristina Sanchez

(57) ABSTRACT

A semiconductor sensor device for detecting an analyte including a semiconducting layer, one or more organic molecules in the semiconducting layer, and one or more receptor molecules, comprising a poly-cyanostilbene macrocycle, wherein the one or more receptors is embedded within or onto the semiconducting layer of the semiconductor sensor device. Also disclosed is a method of preparing (Continued)

the semiconductor sensor device including a step of coupling the one or more receptor molecules into or onto the semiconducting layer of the semiconductor sensor device, a dielectric surface, or an electrode surface. Also described is chemical sensing device including the semiconductor sensor device and other elements of a sensing device.

20 Claims, 29 Drawing Sheets

(56) References Cited

U.S. PATENT DOCUMENTS

| | | | |
|---|---|---|---|
| 7,863,085 B2 | 1/2011 | Lim et al. | |
| 8,022,097 B2 | 9/2011 | Basaric et al. | |
| 8,030,645 B2 | 10/2011 | Takeuchi et al. | |
| 9,541,522 B2 | 1/2017 | Lieber et al. | |
| 9,575,029 B2 | 2/2017 | Torsi et al. | |
| 9,701,621 B2 | 7/2017 | Flood et al. | |
| 9,851,326 B2 | 12/2017 | Viens et al. | |
| 9,874,539 B2 | 1/2018 | Hu et al. | |
| 9,891,200 B2 | 2/2018 | Puranik et al. | |
| 9,910,007 B2 | 3/2018 | Fuerst et al. | |
| 10,077,233 B2 | 9/2018 | Flood et al. | |
| 10,234,416 B2 | 3/2019 | Suzuki et al. | |
| 10,444,249 B2 | 10/2019 | Fukushima et al. | |
| 10,514,370 B2 | 12/2019 | Masih et al. | |
| 10,845,323 B2 | 11/2020 | Kawarada et al. | |
| 2013/0240841 A1* | 9/2013 | Wu | H10K 71/40 |
| | | | 257/E51.027 |
| 2015/0376122 A1* | 12/2015 | Flood | C07D 213/57 |
| | | | 548/255 |
| 2016/0118588 A1* | 4/2016 | Kim | H10K 85/151 |
| | | | 526/240 |
| 2018/0052136 A1* | 2/2018 | Diao | H10K 71/20 |
| 2019/0033303 A1 | 1/2019 | Tyler et al. | |
| 2020/0150076 A1* | 5/2020 | Sbircea | G01N 27/4145 |

OTHER PUBLICATIONS

Cai, Jiajia, et al. "Neutral CH and cationic CH donor groups as anion receptors." Chemical Society Reviews 43.17 (2014): 6198-6213.

Hua, Yuran, and Amar H. Flood. "Click chemistry generates privileged CH hydrogen-bonding triazoles: the latest addition to anion supramolecular chemistry." Chemical Society Reviews 39.4 (2010): 1262-1271.

Langton, Matthew J., et al. "Anion Recognition in Water: Recent Advances from a Supramolecular and Macromolecular Perspective." Angewandte Chemie International Edition 55.6 (2016): 1974-1987.

Lee, Semin, et al. "A pentagonal cyanostar macrocycle with cyanostilbene CH donors binds anions and forms dialkylphosphate [3] rotaxanes." Nature Chemistry 5.8 (2013): 704-710.

Li, Hui, et al. "Chemical and Biomolecule Sensing with Organic Field-Effect Transistors." Chemical reviews 119.1(2019): 3-35.

Zahran, Elsayed M., et al. "Cyanostar: C—H Hydrogen Bonding Neutral Carrier Scaffold for Anion-Selective Sensors." Analytical Chemistry 90.3 (2018): 1925-1933.

* cited by examiner

MACROCYCLE EMBEDDED ORGANIC ELECTRONIC MATERIALS, COMPOSITES, AND COMPOSITIONS FOR CHEMICAL SENSING

CROSS REFERENCE TO RELATED APPLICATIONS

This application claims the benefit of U.S. Provisional Application No. 63/109,789, filed on Nov. 4, 2020, the disclosure of which is hereby incorporated by reference in its entirety herein.

STATEMENT OF GOVERNMENT SUPPORT

This invention was made with government support under Contract No. N00014-19-1-2687 awarded by the Office of Naval Research and under Contract Nos. OIA-1632825, CHE-1709909 and CHE-2105848 awarded by the National Science Foundation. The Government has certain rights in the invention.

FIELD OF THE INVENTION

This invention generally relates to novel organic semiconductor (OSC) and macrocycle compositions, methods for their preparation, and electronic devices useful for the sensing of various analytes such as anions. In one embodiment, the invention utilizes a composite film containing an OSC and a selective receptor that supports host-guest complexation. This provides electronically tunable solid-state films that enable electronic detection with state-of-the-art sensitivity and selectivity towards anions. The compositions and resulting electronic devices enable robust operation in complex aqueous environments, offering suitability for a variety of sensing applications.

BACKGROUND OF THE INVENTION

OSCs have afforded a new generation of (opto)electronic technologies owing to their synthetic modularity, distinct manufacturing paradigms, rich variety of optical and transport phenomena, and opportunities for innovation in device structures not possible with their inorganic counterparts. Research efforts have enabled the development of commercially relevant technologies such as organic photovoltaics (OPVs),[1] light-emitting diodes (OLEDs),[2] field-effect transistors (OFETs),[3] and sensors. In particular, OFETs have enabled commercially viable plastic electronic devices that benefit from chemical tunability, low-cost, large-area, and scalable fabrication, mechanical flexibility, and tolerance toward structural defects and disorder. When compared to two-terminal electronic devices (i.e. chemiresistors), three-terminal OFETs have demonstrated improved utility in diverse technologies and exhibit unparalleled modularity toward sensing a wide variety of biological, chemical, and physical analytes.[4-5] OFETs operating in an aqueous environment, and their application in chemical and biological detection, are an emerging technology anticipated to have profound effects on biomedicine, healthcare, agriculture, and the environment.[6-10]

For the construction of biological and chemical sensors, two device configurations are widely utilized; (1) the conventional OFET, where the semiconducting layer is exposed to the environment, and (2) the electrolyte-gated OFET (EGOFET),[11] where the gate dielectric in the conventional OFET is replaced by an electrolyte. In order to realize selective detection, specific chemistries can be incorporated within the device to enable the molecular recognition of the target analyte.[12] Currently, major limitations include a lack of available recognition elements for the specific detection of important analytes, a lack of specific/tailored interactions between the OFET and the analyte suitable for signal transduction, and a low number of OSCs that demonstrate stability in aqueous environments. Therefore, the incorporation of specific receptor-analyte interactions is necessary for transducing an analyte-binding event into a useable signal within transistor-based chemical sensors. For example, Knopfmacher et al. reported state-of-the-art OFET sensors that are stable in seawater over extended periods of time based on a solution-processable isoindigo-based polymer. In order to achieve selective $Hg^{2+}$ detection, gold nanoparticles (AuNPs) functionalized with a 33-base thiolated DNA aptamer (previously reported to demonstrate selective binding with $Hg^{2+}$) were incorporated onto the surface of the OFET.[13] Binding of $Hg^{2+}$ induces a conformational change in the aptamer, which increases the density of negative charges in the vicinity of the OFETs surface. This changes the surface potential and affects the current that flows in the conductive channel of the OFET via the field-effect. Of significant interest is that detection in the M ($10^{-6}$) range could be achieved at a relatively low density of the receptor on the surface. Other pathways to modify the OFET characteristics include charge trapping, doping and dedoping effects, morphological changes, and modification to the semiconductor/dielectric interface. Thus, the analyte serves as an extrinsic influence on key device parameters such as the field-effect mobility, threshold voltage, on/off ratio, and conductivity. Recent literature has exemplified the utility of biogenic substances, synthetic small molecules, and molecularly imprinted polymers (MIPs) as recognition units to convert chemical reactions or binding events into electrical signals, providing compatibility with digital readout methods.[14]

However, the recognition of analytes in aqueous media remains a fundamental challenge toward the development of high-performance sensor platforms. As a main constituent in biological and environmental systems, water is a competitive polar solvent and creates a strong hydration sphere (several molecules thick) around the ionic analyte. The strength of the chemical bonds between the analyte and water molecules in the primary hydration shell are directly and inversely proportional to the electric charge and ionic radius, respectively. Over the past two decades there have been remarkable breakthroughs in the design and synthesis of receptors capable of sensing trace quantities of ionic analytes within environments mimicking real-world conditions.[15] The recognition and detection of these analytes in these systems rely on modular aromatic CH bonding motifs, chemistries characterized by their net charge-neutrality and strong electropositive, size-selective central cavities.[16-19] Some of these macrocyclic chemistries have shown success in binding analytes in "real-world" conditions deviating from controlled laboratory environments. However, there have been no reports to date on the utilization of highly planar, π-conjugated macrocyclic receptors as recognition probes to detect analytes using OFET-based technologies. Such a method would enable the development of low-cost, highly sensitive, and selective OFET-based sensors which would be operational in a variety of device geometries and configurations including conventional OFETs, EGOFETs, and organic electrochemical transistors (OECTs). This strategy would also apply to other electrode-based sensors, such as chemiresistors that operate through changes in electrical resistance.

SUMMARY OF THE INVENTION

The present invention provides novel soft matter transistor-based devices that are prepared using straightforward processing methods and result in highly sensitive, selective, and reproducible sensors for the detection of analytes such as anions. The devices contain a semiconducting layer which is comprised of a mixture of a conjugated polymer and a receptor molecule with the ability to selectively bind anions/analytes through host-guest complexation. The binding is determined by the structure, size, geometry, and electronic properties of the receptor-analyte interaction as well as the composite/matrix environment. The invention provides novel sensing technologies that afford state-of-the-art sensitivity and selectivity suitable for a wide variety of analytes such as anions. Alterations of electrical properties of the semiconducting layer and corresponding device performance are achieved by varying the composition of the receptor within the semiconducting polymer matrix, resulting in a tunability of the electrical properties over a wide range. Host-guest complexation of the receptor and analyte affect the bulk electric properties in a manner that is suitable for use with electronic readouts. With the foregoing and other features and advantages of the present invention that will become apparent, the nature of the invention may be determined from by the following description of preferred embodiments and appended claims.

The present invention may be described by the following sentences:

1. In a first aspect, the present disclosure relates to a semiconductor sensor device for detecting an analyte, including
   a semiconducting layer,
   one or more organic molecules in the semiconducting layer, and
   one or more receptor molecules, comprising a polycyanostilbene macrocycle according to Formula I:

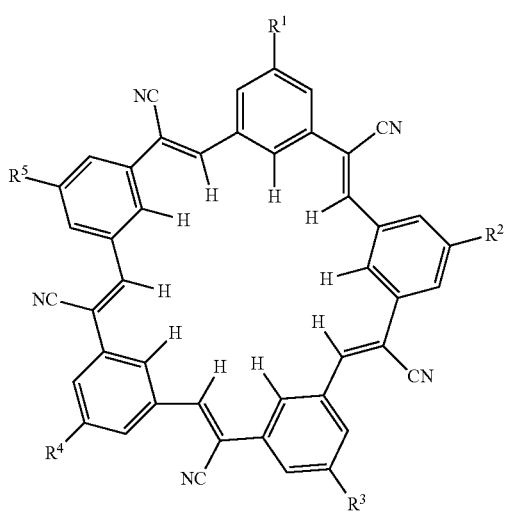

(I)

wherein $R^1$, $R^2$, $R^3$, $R^4$ and $R^5$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, —(CH$_2$)$_{1-20}$—NH—(CH$_2$)$_{1-20}$—CH$_3$, hydrogen, ethynyl, arylethynylene, -halo, —OR$^9$, —N(R$^{10}$R$^{11}$), —CO$_2$R$^{12}$, —C(O)—N(R$^{13}$R$^{14}$), wherein $R^9$, $R^{10}$, $R^{11}$, $R^{12}$, $R^{13}$, and $R^{14}$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, —(CH$_2$)$_{1-20}$—NH—(CH$_2$)$_{1-20}$—CH$_3$, hydrogen, wherein the one or more receptor molecules are embedded within or onto the semiconducting layer of the semiconductor sensor device.

2. The device of sentence 1, wherein the one or more organic molecules may include small molecules having a number average molecule weight of from about 50 g/mol to about 5,000 g/mol, as measured by gel permeation chromatography and/or NMR.

3. The device of any one of sentences 1-2, wherein the one or more organic molecules may include a polymer comprising repeat units (n)≥15, and having a molecular weight from about 15,000 g/mol to about 500,000 g/mol, as measured by gel permeation chromatography.

4. The device of any one of sentences 1-3, may have a loading percentage of the one or more organic molecules to the one or more receptor molecules from about 1 to about 50 wt. %

5. The device of any one of sentences 1-4, wherein $R^1$, $R^2$, $R^3$, $R^4$ and $R^5$ may each a tert-butyl group.

6. The device of any one of sentences 1-5, wherein the one or more organic molecules may include poly[[2,5-bis(2-decyltetradecyl)-2,3,5,6-tetrahydro-3,6-dioxopyrrolo[3,4-c]pyrrole-1,4-diyl][2,2'-bithiophene]-5,5'-diyl-(1E)-1,2-ethenediyl[2,2'-bithiophene]-5,5'-diyl](PDVT).

7. The device of any one of sentences 1-4, wherein the one or more organic molecules may include a conjugated polymer according to Formula (II):

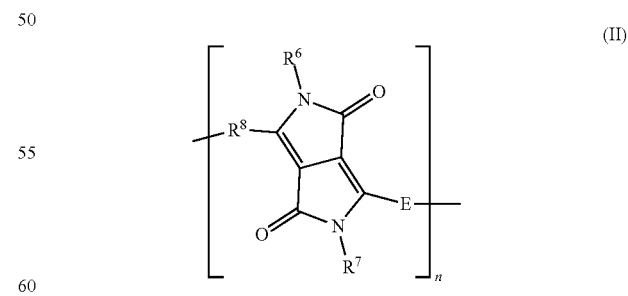

(II)

wherein E represents an "electron donating group", $R^6$ and $R^7$ are each independently selected from a hydrocarbyl group comprising from 1 to about 50 carbon atoms, $R^8$ may be a hydrocarbyl group comprising from 1 to about 20 carbon atoms, or a thiophene group, and n may be an integer of greater than 15.

8. The device of any one of sentences 1-7, may further include a two-terminal chemresistor, comprising a source electrode and a drain electrode with a chemically sensitive semiconductor material comprising a channel.

9. The device of any one of sentences 1-7, may further include a three-terminal transistor, comprising a source, a drain, and a gate electrode, configured to enhance the electrical conductivity of a chemically sensitive semiconductor material.

10. In a second aspect, the present disclosure relates to a method of preparing the semiconductor sensor device of any one of sentences 1-9, including a step of coupling the one or more receptor molecules into or onto the semiconducting layer of the semiconductor sensor device, a dielectric surface, or an electrode surface.

11. The method of sentence 10, wherein the one or more organic molecules and the one or more receptor molecules may be deposited via spin-coating, drop-casting, dip-coating, slot-die coating, doctor blading, or bar coating to form one or more semiconducting layers.

12. The method of any one of sentences 1-11, wherein the one or more organic molecules and the one or more receptor molecules may be within a same layer of the device.

13. The method of any one of sentences 1-11, wherein the one or more organic molecules and the one or more receptor molecules may be in different layers of the device.

14. The method of any one of sentences 1-12, wherein the one or more receptors may be chemically incorporated into the one or more organic molecules via chemical reaction throughout a same layer of the device.

15. The method of any one of sentences 1-12, wherein the one or more receptor molecules may be physically entrapped in the semiconducting layer.

16. In a third aspect, the present disclosure relates to a chemical sensor system for detecting analyte including a semiconductor sensor device comprising one or more transistors, and each of the one or more transistors comprises a conductive channel, and the conductive channel comprises a semiconducting layer comprising one or more organic molecules, and one or more receptor molecules, comprising a poly-cyanostilbene macrocycle according to Formula (I):

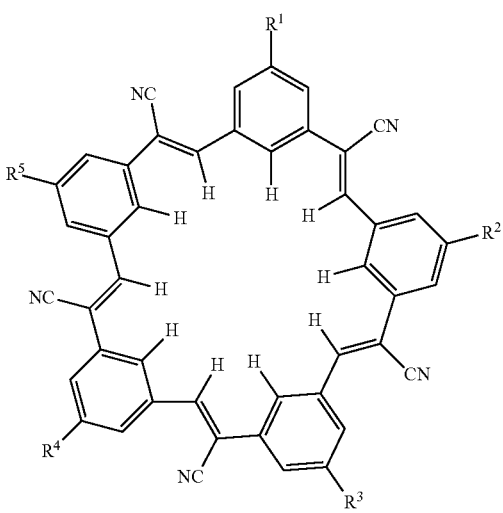

wherein $R^1$, $R^2$, $R^3$, $R^4$, and $R^5$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, —$(CH_2)_{1-20}$—NH—$(CH_2)_{1-20}$—$CH_3$, hydrogen, ethynyl, arylethynylene, -halo, —$OR^9$, —$N(R^{10}R^{11})$, —$CO_2R^{12}$, —$C(O)$—$N(R^{13}R^{14})$, wherein $R^9$, $R^{10}$, $R^{11}$, $R^{12}$, $R^{13}$, and $R^{14}$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, —$(CH_2)_{1-20}$—NH—$(CH_2)_{1-20}$—$CH_3$, hydrogen, wherein the one or more receptors is embedded within or onto the semiconducting film of the semiconductor sensor device, a sample configured to hold a target molecule and the target molecule has a selective affinity to bind with the one or more receptor molecules, an assay system configured to bring the semiconductor sensor device in contact with the sample, a digital read-out, and a data processing system.

17. The system of sentence 16, wherein the system may include two or more semiconductor sensor devices.

18. The system of any one of sentences 16-17, wherein the system may be configured to operate through the chemical doping of a semiconducting layer upon interaction with the analyte, wherein the semiconducting layer comprises the one or more receptor molecules.

19. The system of any one of sentences 16-17, wherein the system may be configured to operate through the chemical dedoping of a semiconducting layer upon interaction with the analyte, wherein the semiconducting layer comprises the one or more receptor molecules.

20. The system of any one of sentences 16-19, wherein the system may be configured to detect a single analyte.

21. The system of any one of sentences 16-19, wherein the system may be configured to detect multiple analytes of different chemical identifies and classifications.

The following definition of terms are provided in order to clarify the meanings of certain terms as used herein.

As used herein, the term "hydrocarbyl substituent" or "hydrocarbyl group" is used in its ordinary sense, which is well-known to those skilled in the art. Specifically, it refers to a group having a carbon atom directly attached to the remainder of the molecule and having a predominantly hydrocarbon character. Each hydrocarbyl group is independently selected from hydrocarbon substituents, and substituted hydrocarbon substituents containing one or more of halo groups, hydroxyl groups, alkoxy groups, mercapto groups, sulfide group, nitro groups, nitroso groups, amino groups, pyridyl groups, furyl groups, imidazolyl groups, oxygen, and nitrogen, and wherein no more than two non-hydrocarbon substituents are present for every ten carbon atoms in the hydrocarbyl group.

As used herein, the term "hydrocarbylene substituent" or "hydrocarbylene group" is used in its ordinary sense, which is well-known to those skilled in the art. Specifically, it refers to a group that is directly attached at two locations of the molecule to the remainder of the molecule by a carbon atom and having predominantly hydrocarbon character. Each hydrocarbylene group is independently selected from divalent hydrocarbon substituents, and substituted divalent hydrocarbon substituents containing halo groups, alkyl groups, aryl groups, alkylaryl groups, arylalkyl groups, hydroxyl groups, alkoxy groups, mercapto groups, nitro groups, nitroso groups, amino groups, pyridyl groups, furyl groups, imidazolyl groups, oxygen and nitrogen, and wherein no more than two non-hydrocarbon substituents is present for every ten carbon atoms in the hydrocarbylene group.

The term "alkyl" as employed herein refers to straight, branched, cyclic, and/or substituted saturated chain moieties of from about 1 to about 100 carbon atoms.

The term "alkenyl" as employed herein refers to straight, branched, cyclic, and/or substituted unsaturated chain moieties of from about 3 to about 10 carbon atoms.

The term "aryl" as employed herein refers to single and multi-ring aromatic compounds that may include alkyl, alkenyl, alkylaryl, amino, hydroxyl, alkoxy, halo substituents, and/or heteroatoms including, but not limited to, nitrogen, oxygen, and sulfur.

BRIEF DESCRIPTION OF THE DRAWINGS

The drawings, which are incorporated in and form a portion of the specification, illustrate certain embodiments of the invention and, together with the entire specification, are meant to explain these embodiments of the present invention to those skilled in the art. The drawings supplement the specification and are intended to illustrate further the invention and its advantages. The figures and drawings shown or described in this disclosure and in the Detailed Description of the Invention are as follows.

DETAILED DESCRIPTION OF INVENTION

Figure 1:
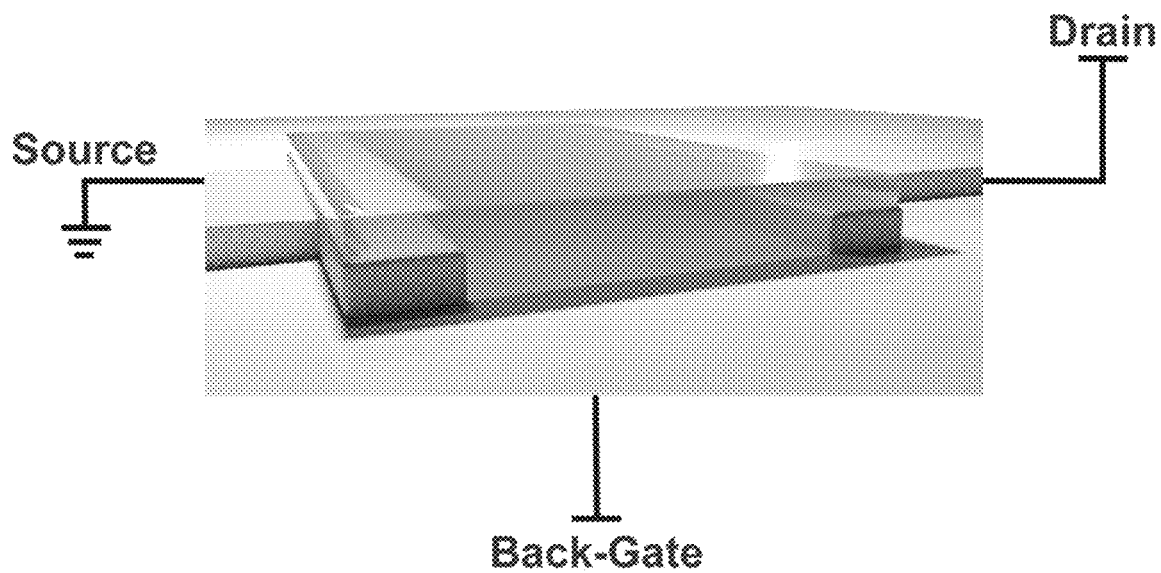
FIG. 1 shows a representation of the OFET device architecture utilized in the present invention.
Figure 2:
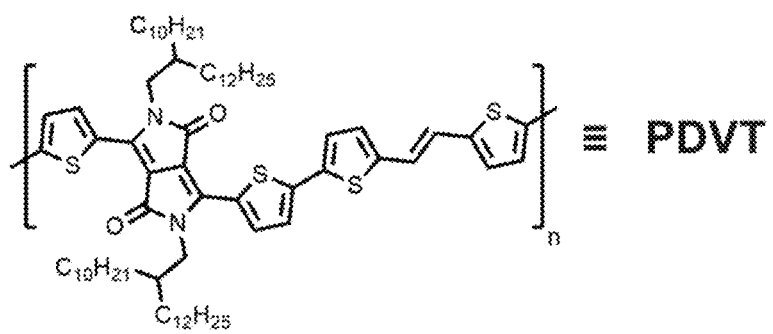
FIG. 2 shows the chemical structures of the OFET semiconducting layer constituents: poly[[2,5-bis(2-decyltetradecyl)-2,3,5,6-tetrahydro-3,6-dioxopyrrolo[3,4-c]pyrrole-1,4-diyl][2,2'-bithiophene]-5,5'-diyl-(1E)-1,2-ethenediyl[2,2'-bithiophene]-5,5'-diyl](PDVT) conjugated polymer and poly-cyanostilbene macrocycle, cyanostar (CS), receptors.
Figure 2:
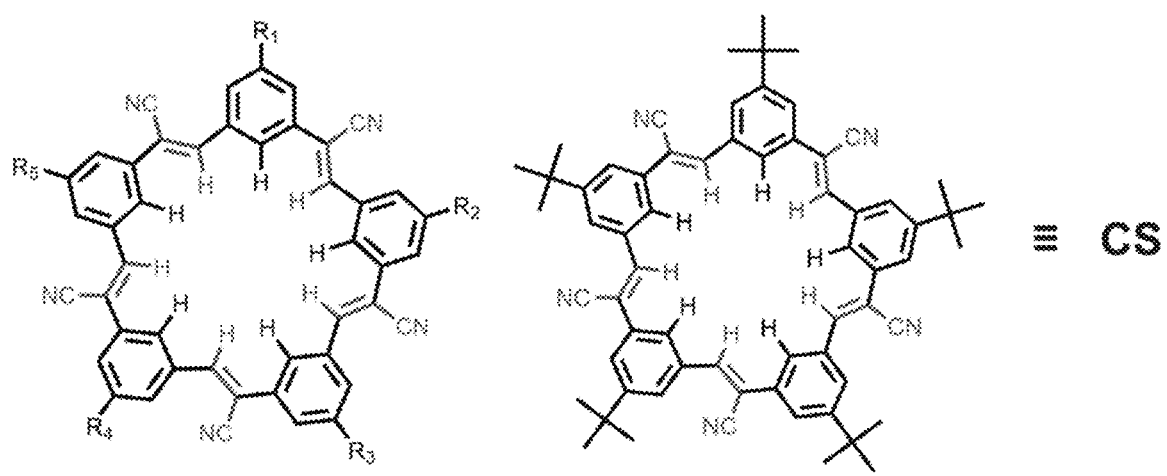
Figure 3:
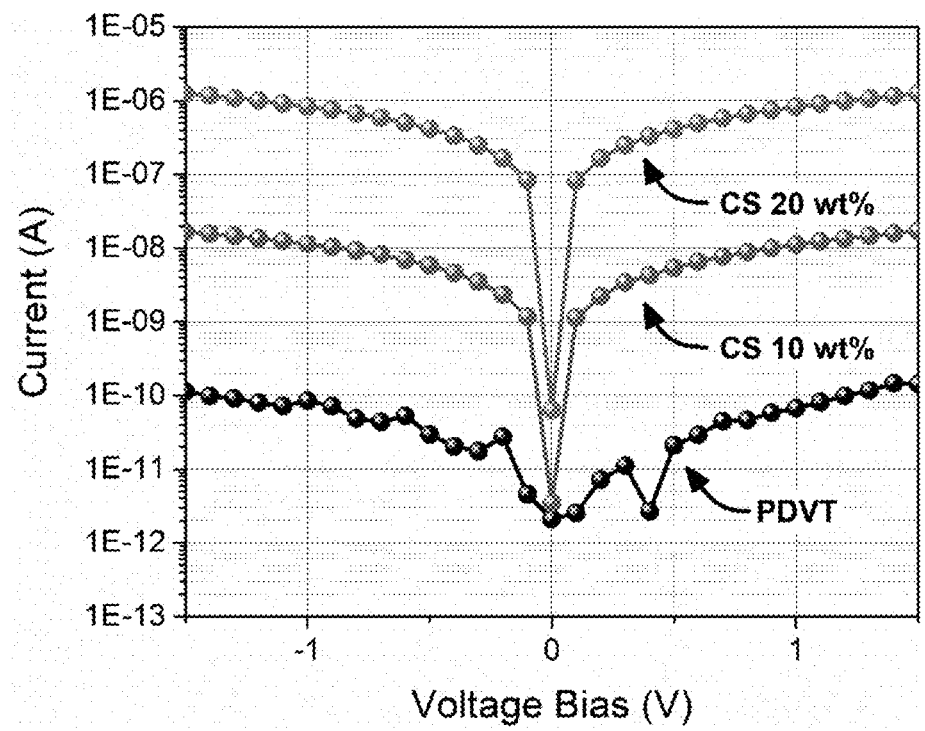
FIG. 3 shows a graphical representation of the current-voltage (I-V) scans of PDVT and PDVT:CS blend films, wherein the horizontal axis represents applied voltage, and the vertical axis represents the electrical current response. Chemical doping trends with a concomitant increase in electrical current response as a function of CS loading within the PDVT host matrix.
Figure 4:
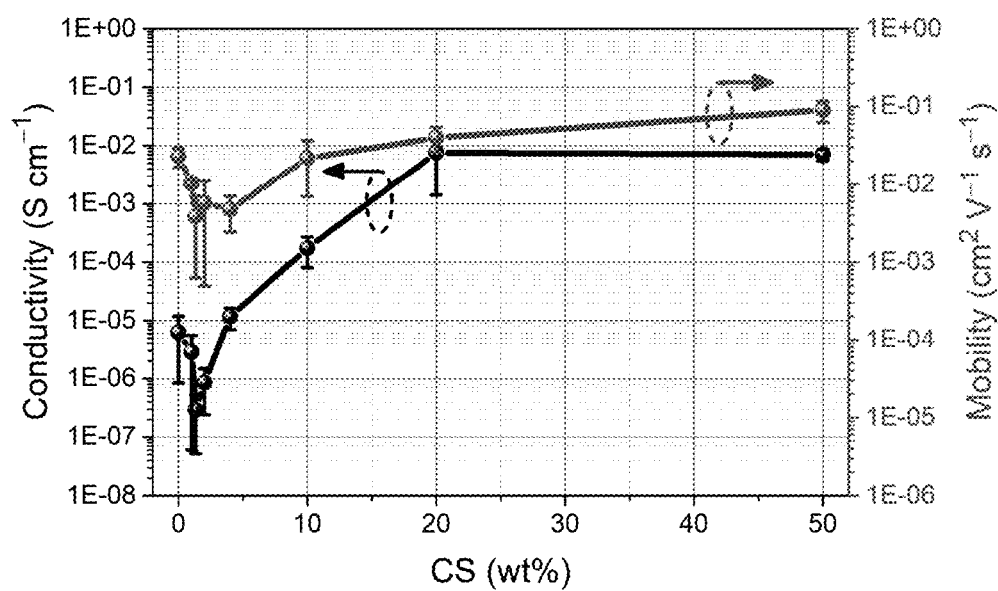
FIG. 4 shows a graphical representation of PDVT:CS blend films, wherein the vertical axes represent conductivity and field-effect mobility.
Figure 5:
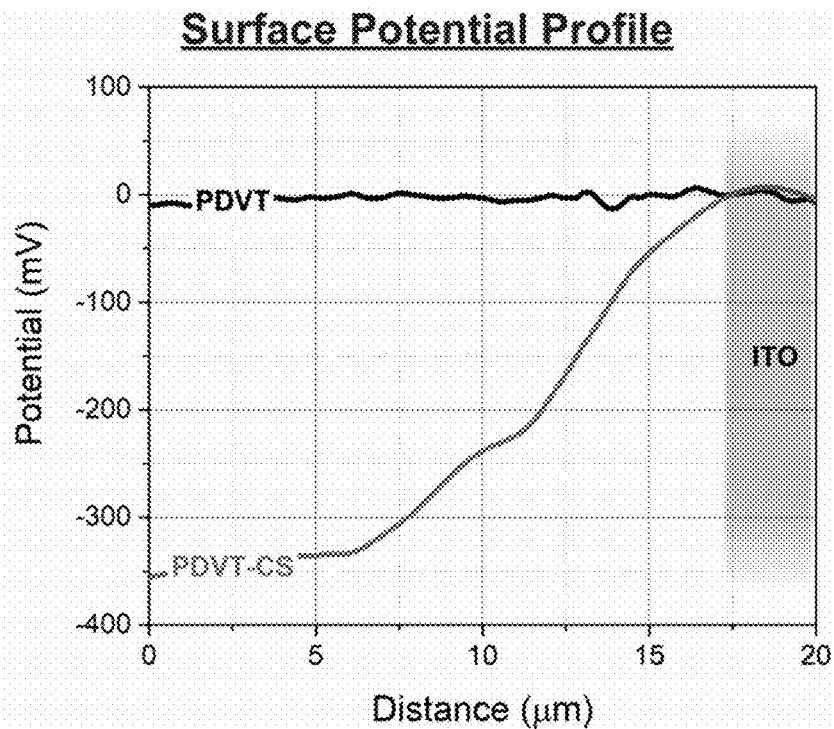
FIG. 5 shows the Kelvin probe force microscopy (KPFM) on the PDVT and PDVT-CS (20 wt %) films deposited on indium tin oxide (ITO) glass substrates. Measurements were performed by scanning over the polymer/ITO border. The surface potential profile between the two films is shown. A drop-off in the potential profile indicates there is a transformation in the surface energetics.
Figure 6:
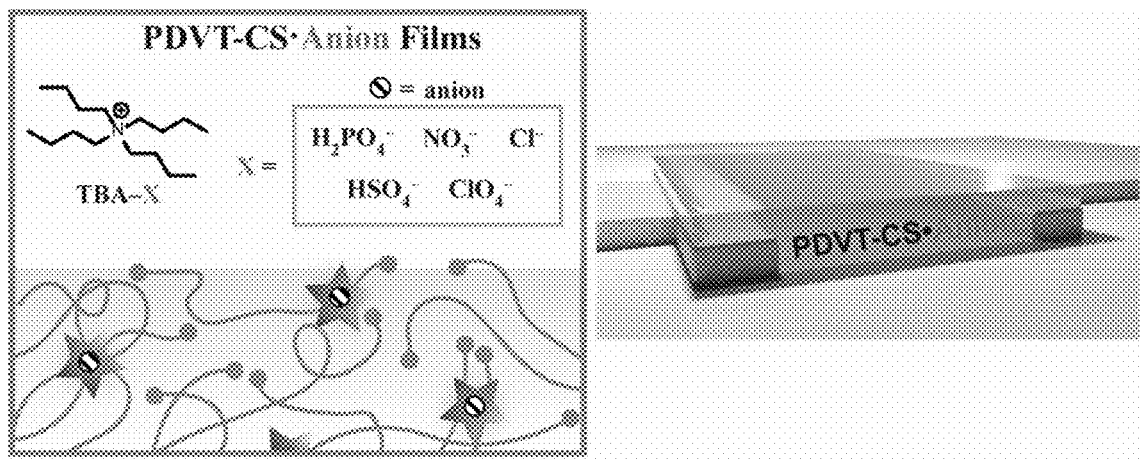
FIG. 6 shows a representation of semiconducting layer constituents PDVT, CS, and tetrabutylammonium (TBA-X, X=dihydrogen phosphate (P), nitrate (N), chloride (Cl), hydrogen sulfate (HS), and perchlorate(PC)) organic salts to study anion-induced electronic perturbations in back-gate transistor architectures.
Figure 7:
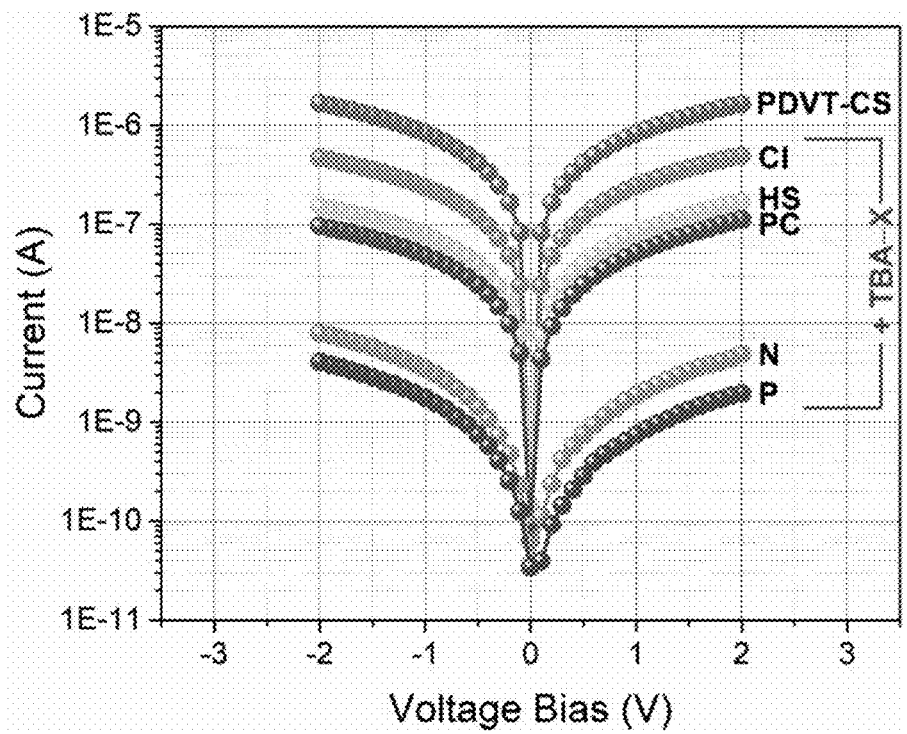
FIG. 7 shows a graphical representation of 2-point probe I-V measurements, wherein the horizontal axis represents applied voltage, and the vertical axis represents the change in current (amperes). The observed reduction in bulk current was found to be attributed to CS-anion host-guest complexation.
Figure 8A:
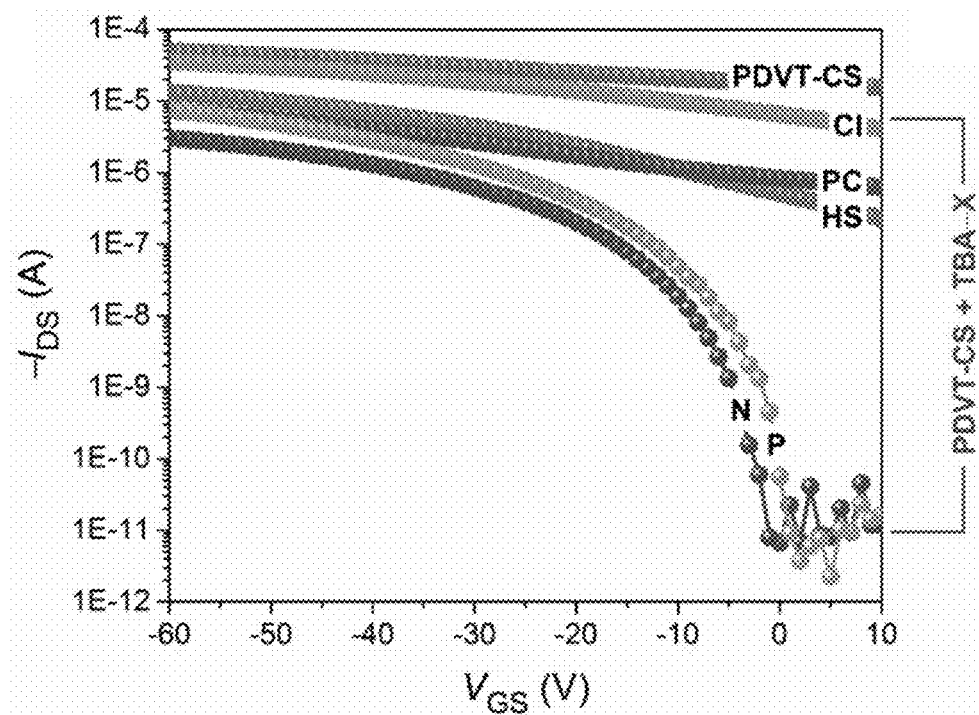
FIG. 8A shows a graphical representation of a back-gate OFET transfer characteristics of PDVT-CS and PDVT-CS•TBA-X films, wherein the horizontal axis represents gate-source voltage ($V_{GS}$), and the vertical axis represents drain-source current ($I_{DS}$) at a constant drain-source voltage ($V_{DS}$) of −60 V.
Figure 8B:
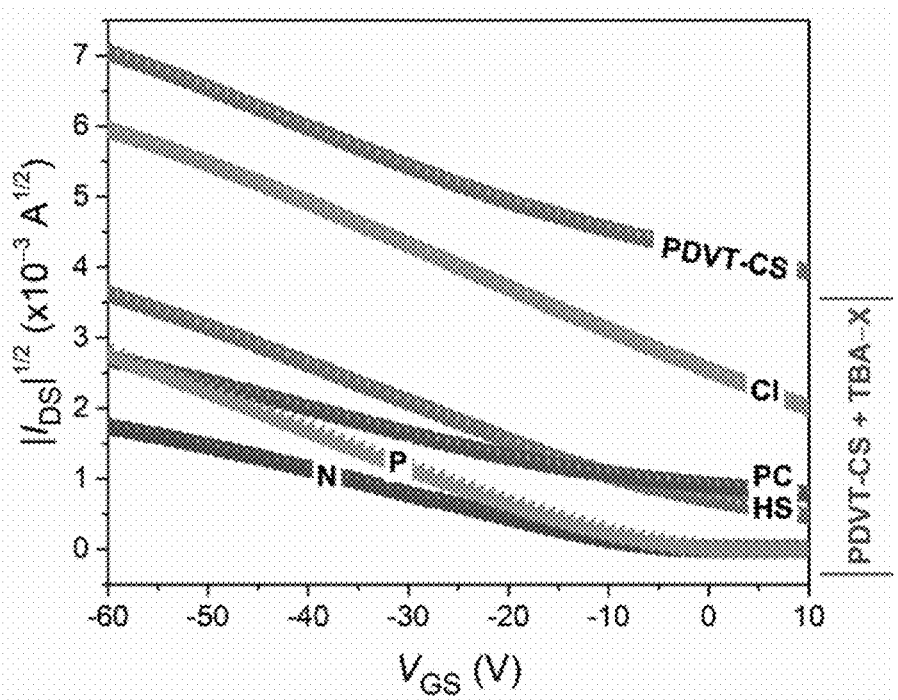
FIG. 8B shows a graphical representation of the transfer characteristics of PDVT-CS and PDVT-CS•TBA-X films, wherein the horizontal axis represents $V_{GS}$, and the vertical axis represents $$\sqrt{I_{DS}}.$$
Figure 9:
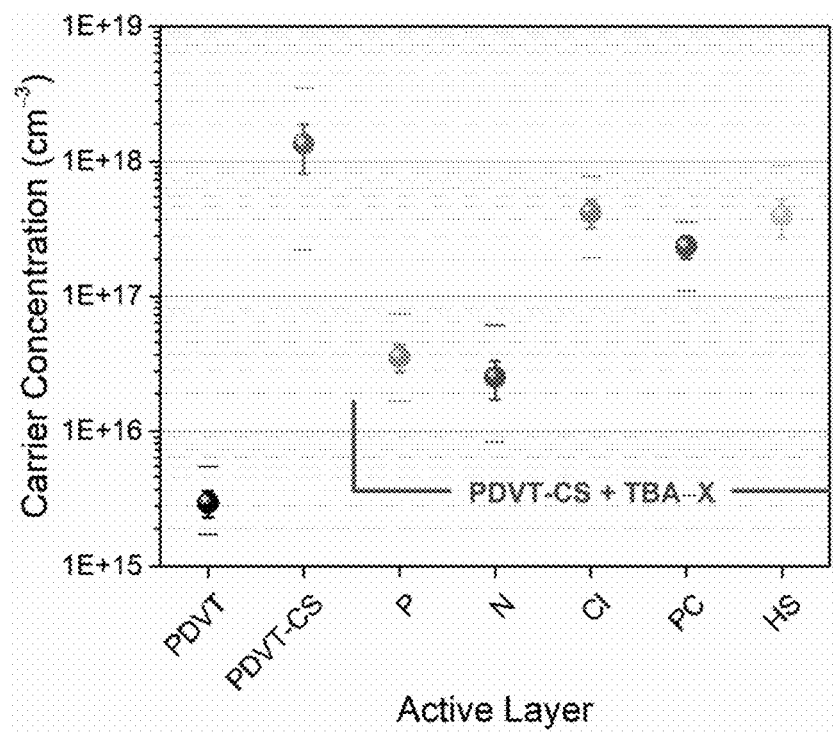
FIG. 9 shows an interval plot representing changes to the carrier concentration for PDVT, PDVT-CS, and PDVT-CS•TBA-X films.
Figure 10:
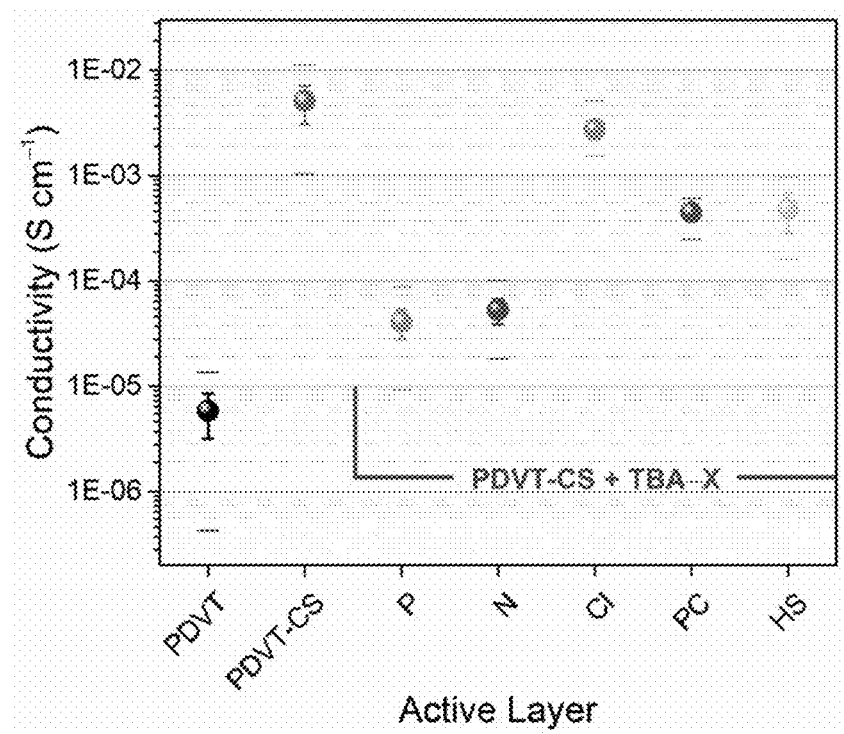
FIG. 10 shows an interval plot representing changes to the bulk conductivity for PDVT, PDVT-CS, and PDVT-CS•TBA-X films.
Figure 11:
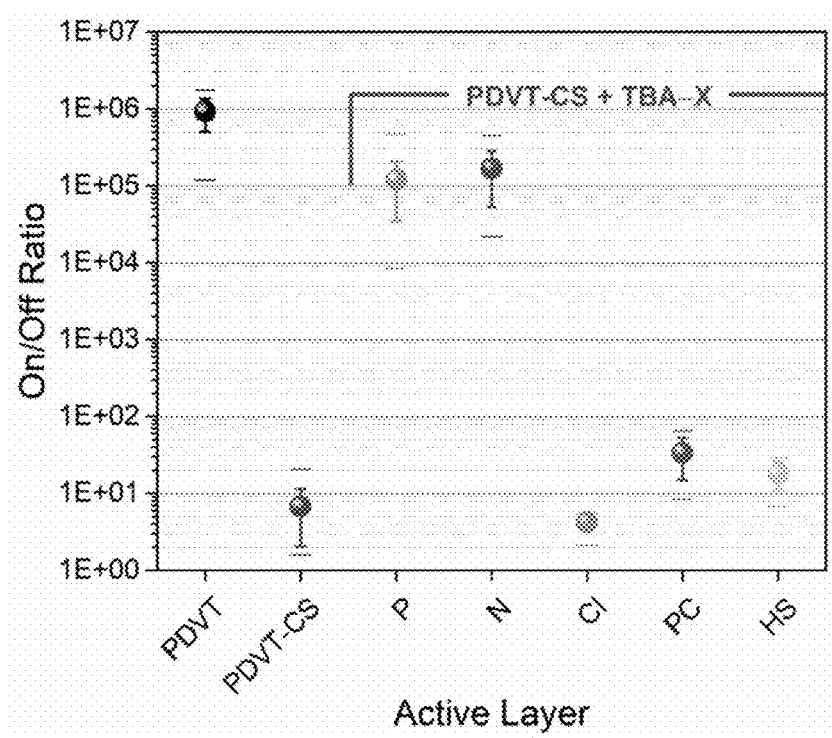
FIG. 11 shows an interval plot representing changes to the OFET on/off ratio for PDVT, PDVT-CS, and PDVT-CS•TBA-X films.
Figure 12:
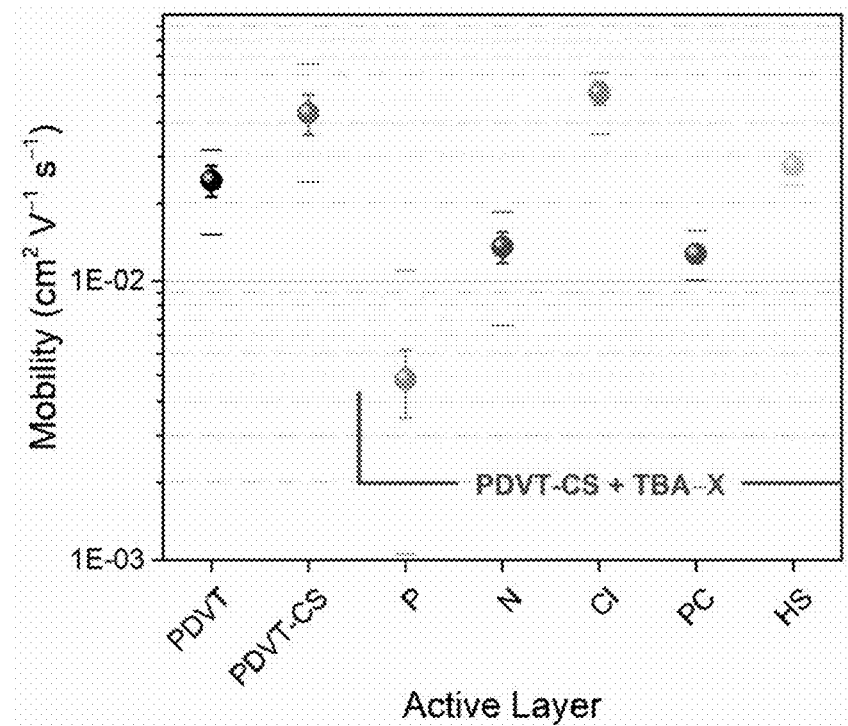
FIG. 12 shows an interval plot representing changes to the OFET mobility for PDVT, PDVT-CS, and PDVT-CS•TBA-X films.
Figure 13A:
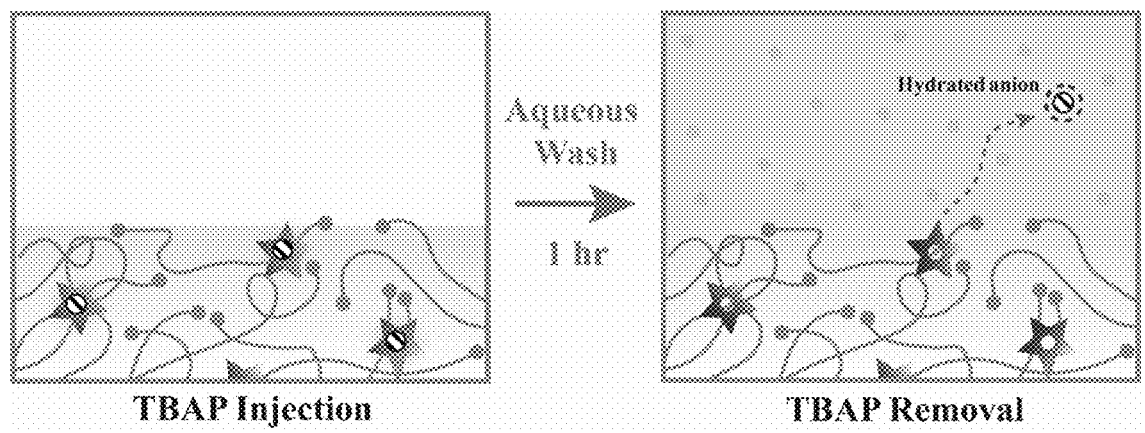
FIG. 13A is an illustration of the receptor's reversible binding. CS-anion complexation and anion removal before and after submersion in deionized (DI) water for 1 hr, respectively
Figure 13B:
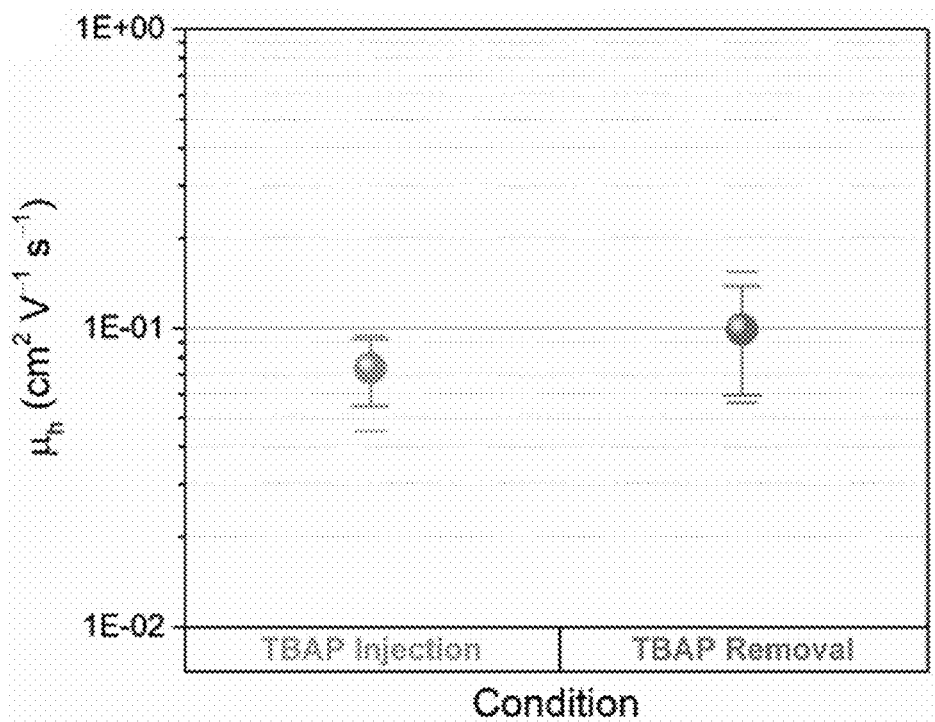
FIG. 13B shows the OFET mobility of CS-anion complexation and anion removal before and after submerging the films in water, respectively.
Figure 13C:
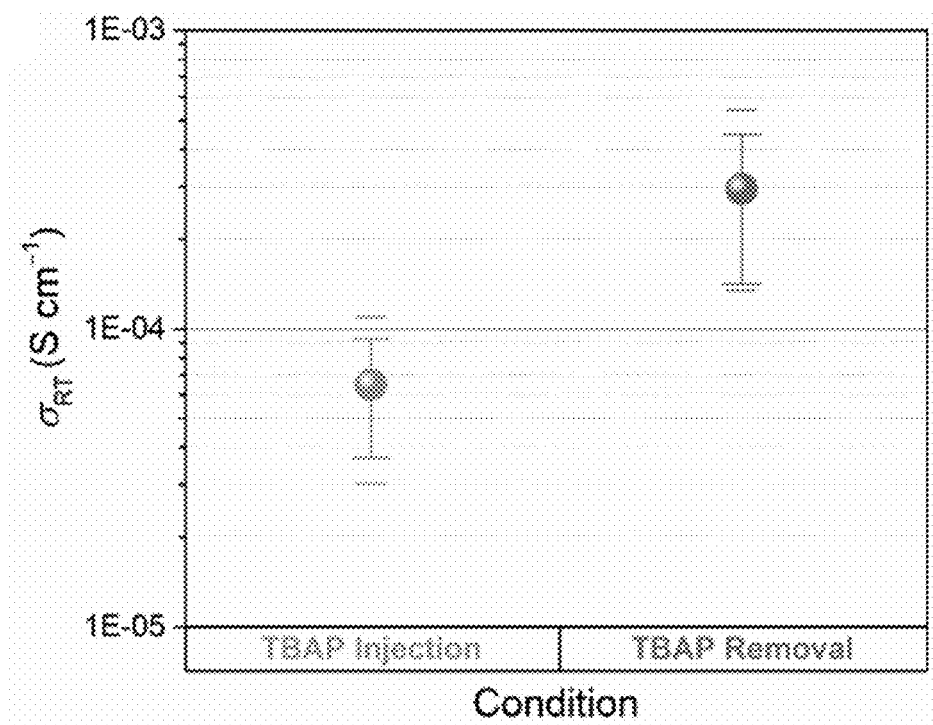
FIG. 13C shows the bulk conductivity of CS-anion complexation and anion removal before and after submerging the films in water, respectively.
Figure 13D:
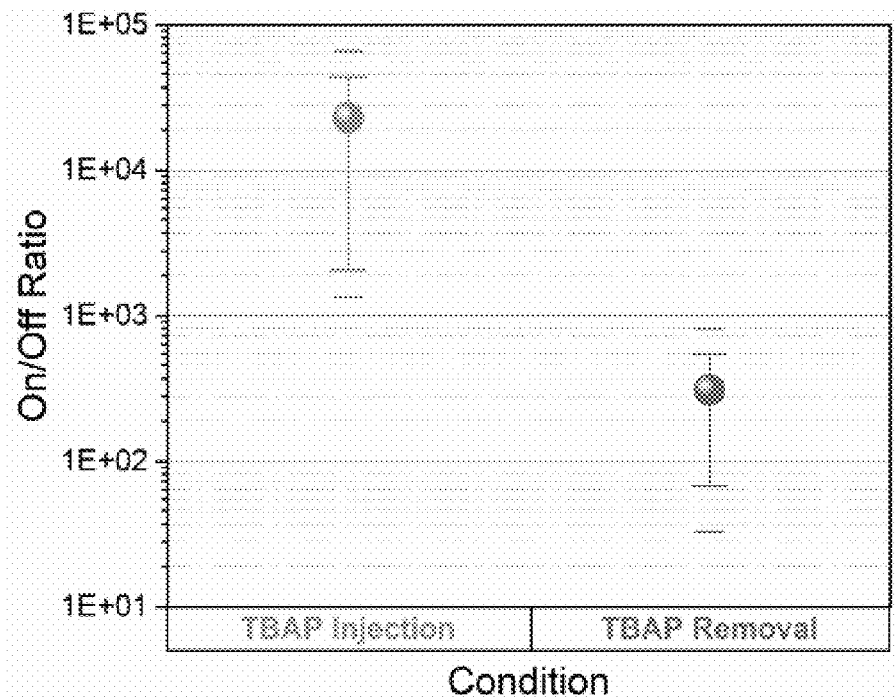
FIG. 13D shows the OFET on/off ratio of CS-anion complexation and anion removal before and after submerging the films in water, respectively.
Figure 13E:
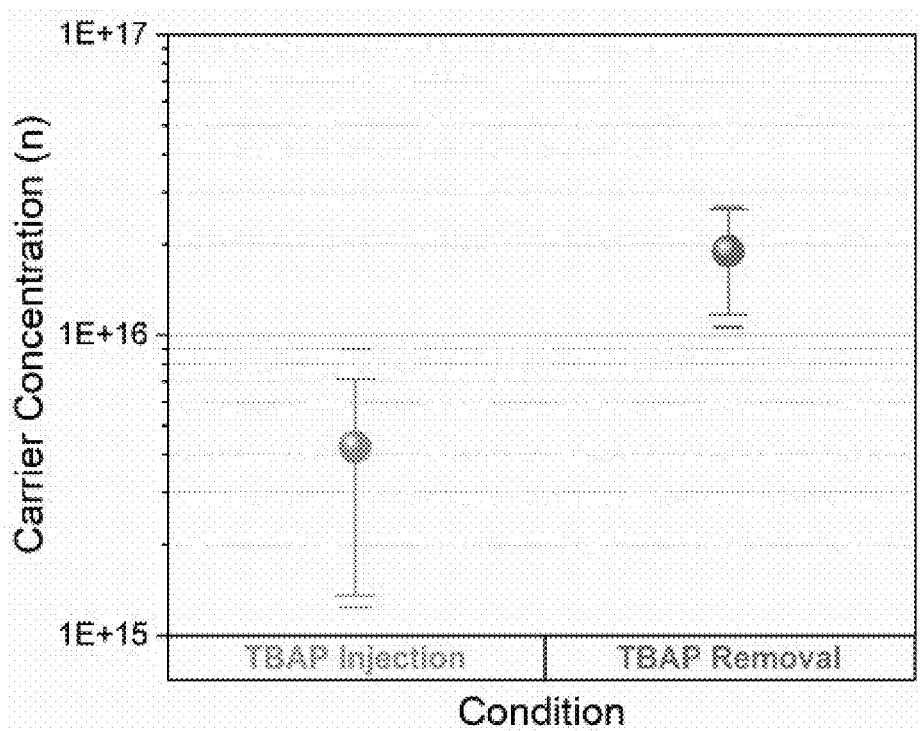
FIG. 13E shows the carrier concentration of CS-anion complexation and anion removal before and after submerging the films in water, respectively.
Figure 14:
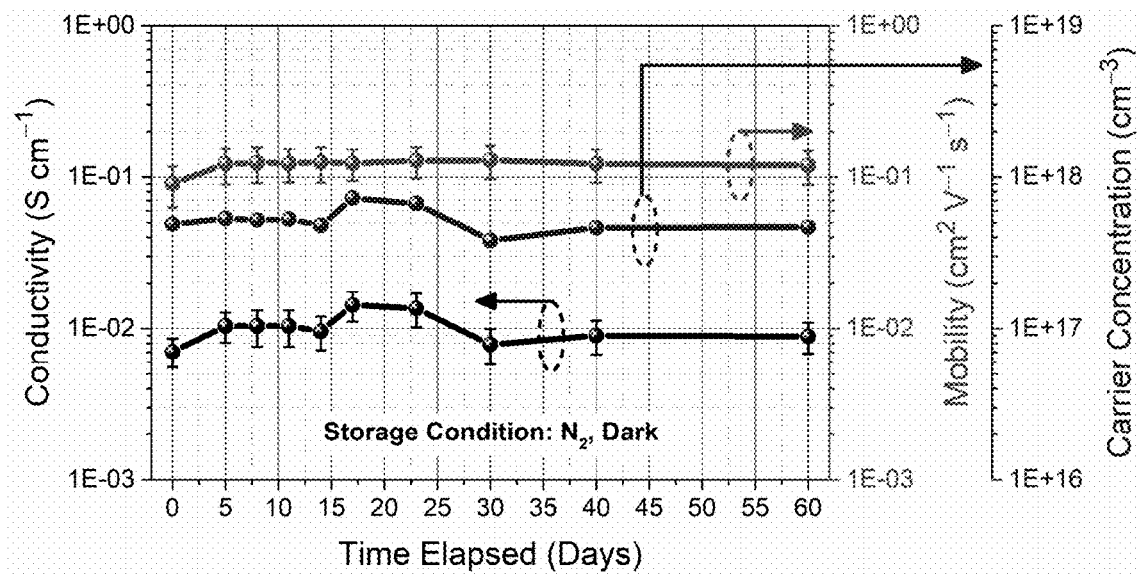
FIG. 14 shows the storage stability of PDVT-CS exposed to $N_2$ (dark) over a 60-day period.
Figure 15:
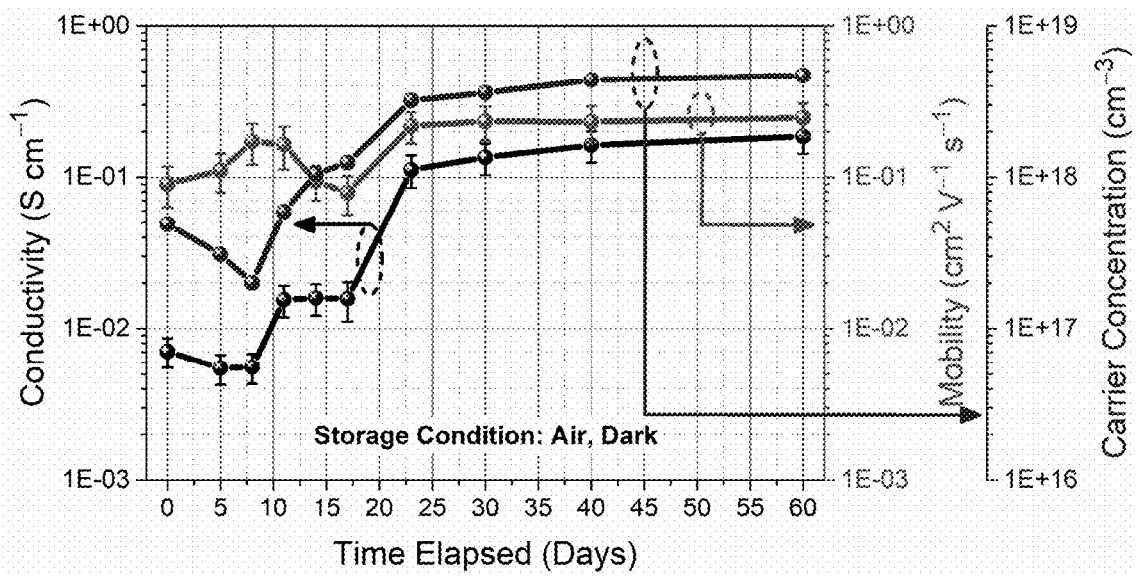
FIG. 15 shows the storage stability of PDVT-CS exposed to air (dark) over a 60-day period.
Figure 16:
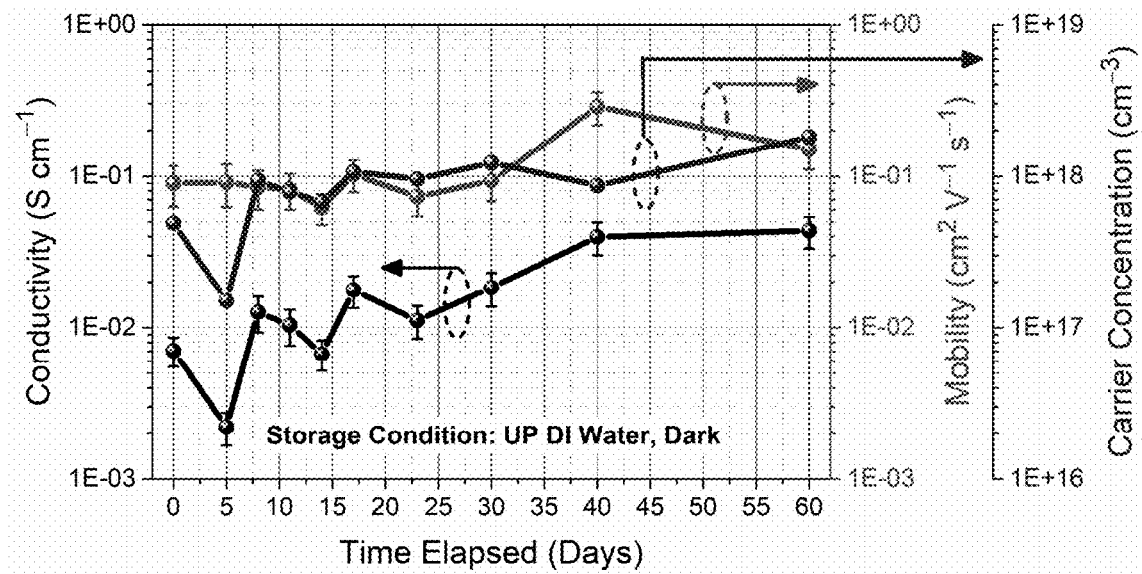
FIG. 16 shows the storage stability of PDVT-CS exposed to ultrapure (UP, Type 1) DI water (dark) over a 60-day period.
Figure 17:
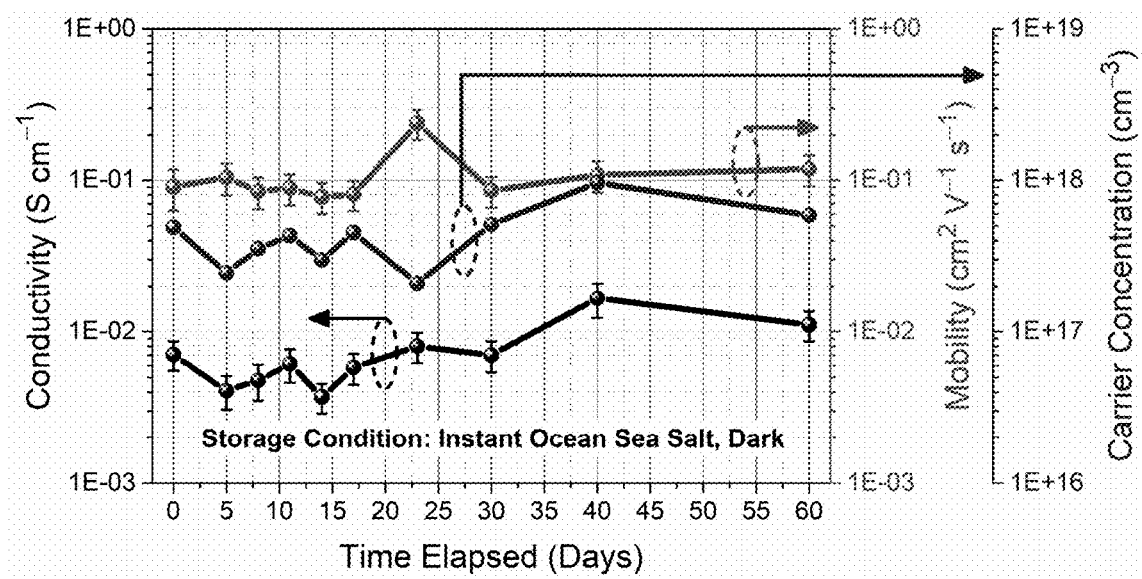
FIG. 17 shows the storage stability of PDVT-CS exposed to Instant Ocean® sea salt electrolyte (dark) over a 60-day period.
Figure 18:
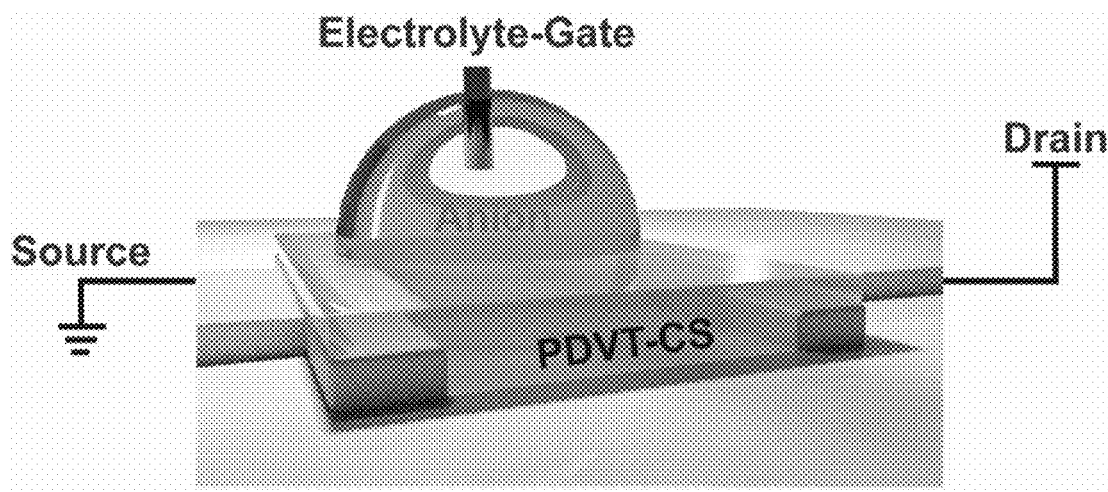
FIG. 18 shows a representation of the PDVT-CS EGO-FET device architecture utilized in the present invention.
Figure 19:
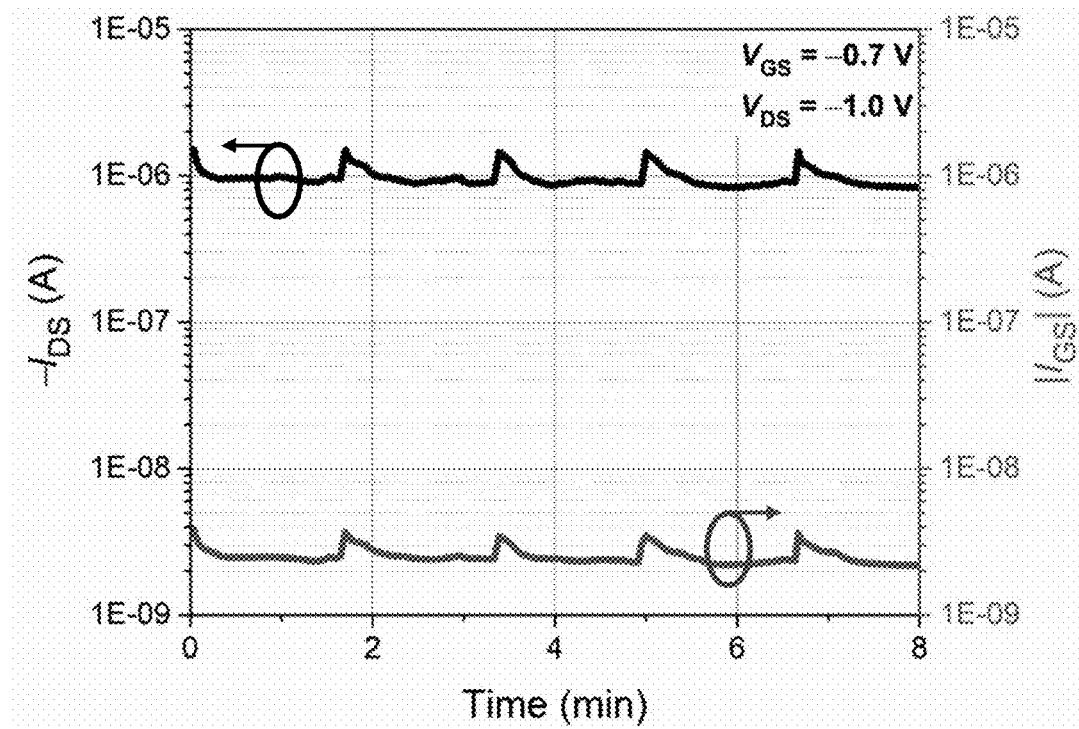
FIG. 19 shows an EGOFET HEPES buffer (baseline solution) transient responses at $V_{GS}$=−0.7 V and $V_{DS}$=−1.0 V.
Figure 20A:
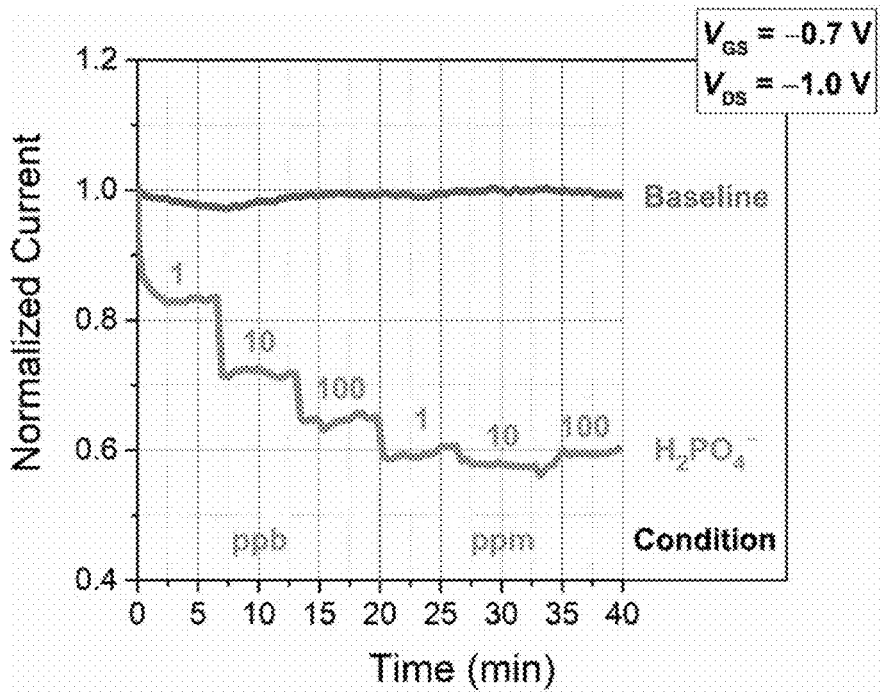
FIG. 20A shows PDVT-CS EGOFET transient responses (at $V_{GS}$=−0.7 V and $V_{DS}$=−1.0 V) towards dihydrogen phosphate ($H_2PO_4^-$) in HEPES solution.
Figure 20B:
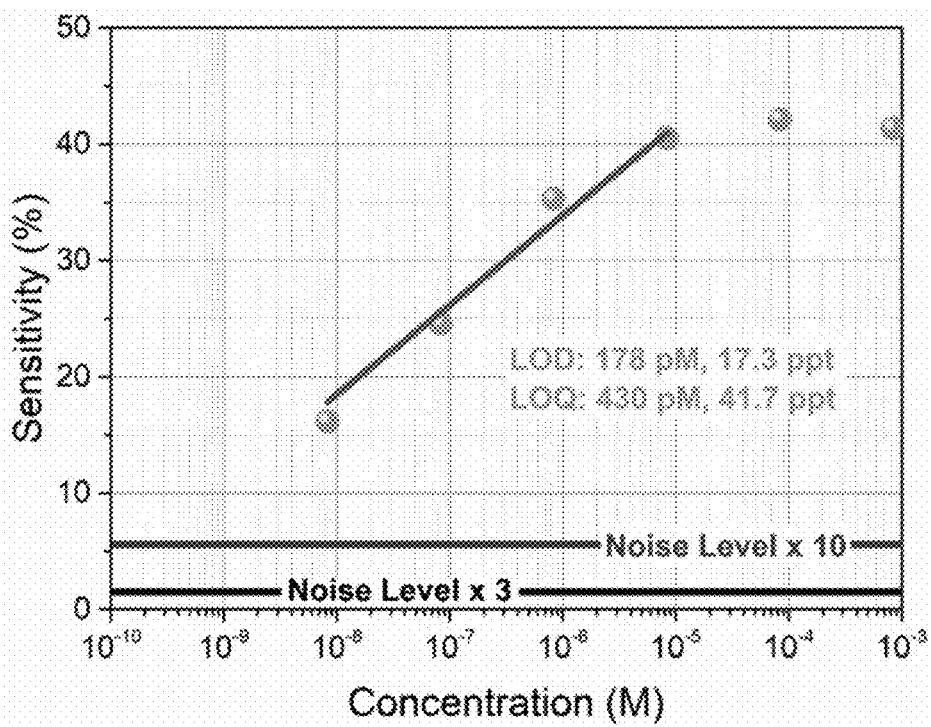
FIG. 20B shows PDVT-CS EGOFET calibration plot towards $H_2PO_4^-$ in HEPES solution.
Figure 21A:
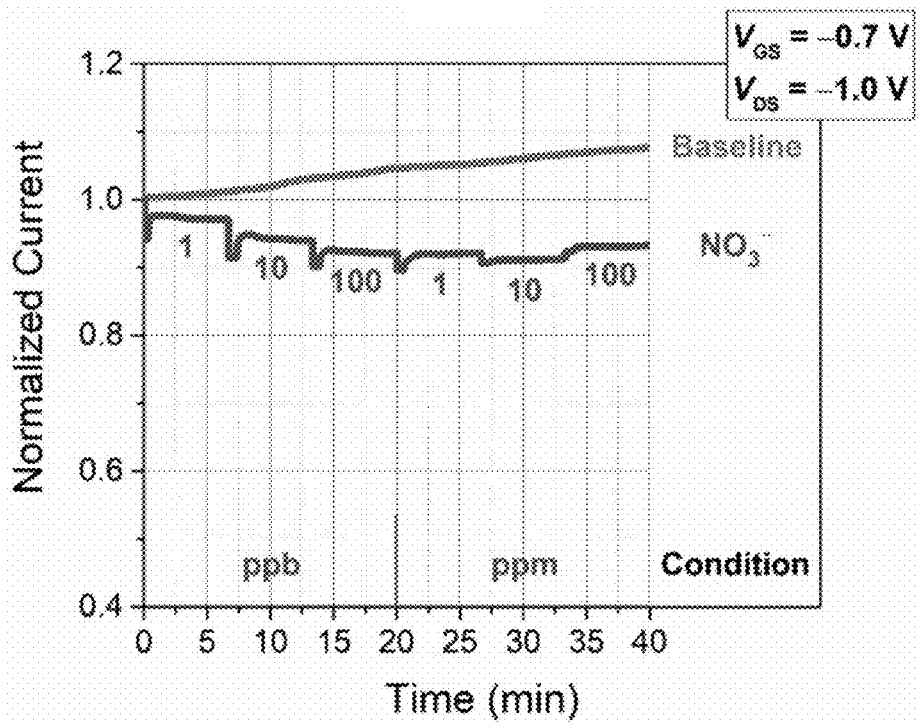
FIG. 21A shows PDVT-CS EGOFET transient responses (at $V_{GS}$=−0.7 V and $V_{DS}$=−1.0 V) towards nitrate ($NO_3^-$) in HEPES solution.
Figure 21B:
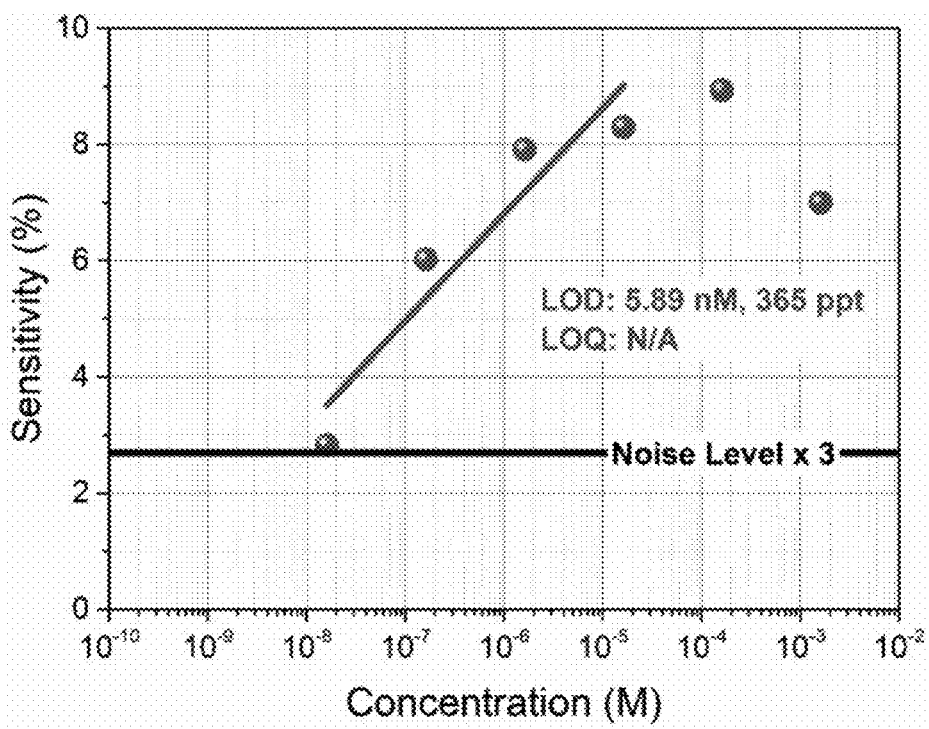
FIG. 21B shows PDVT-CS EGOFET calibration plot towards $NO_3$ in HEPES solution.
Figure 22A:
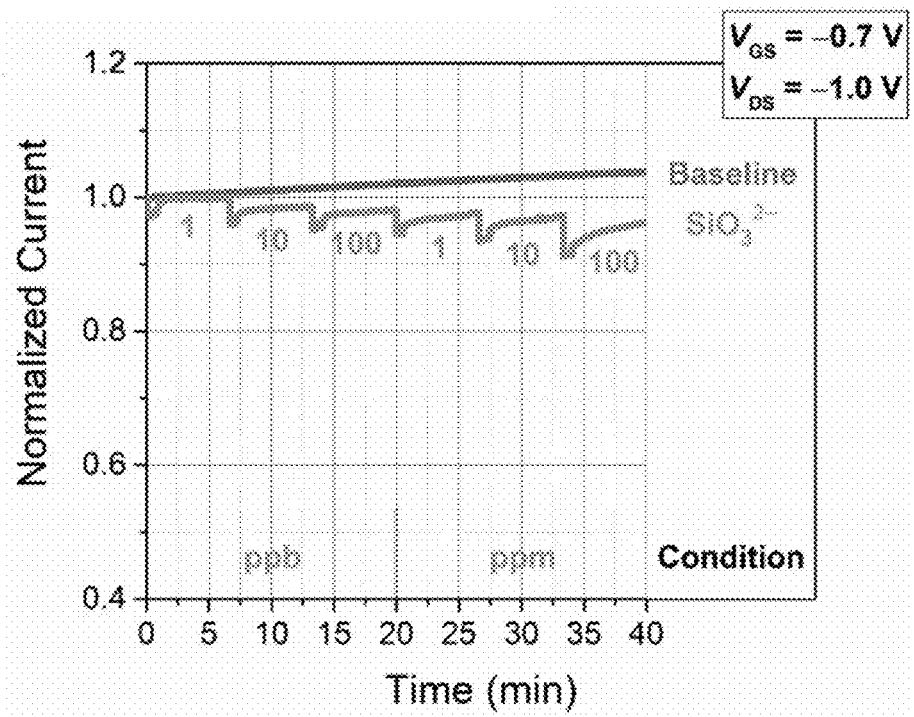
FIG. 22A shows PDVT-CS EGOFET transient responses (at $V_{GS}$=−0.7 V and $V_{DS}$=−1.0 V) towards metasilicate ($SiO_3^{2-}$) in HEPES solution.
Figure 22B:
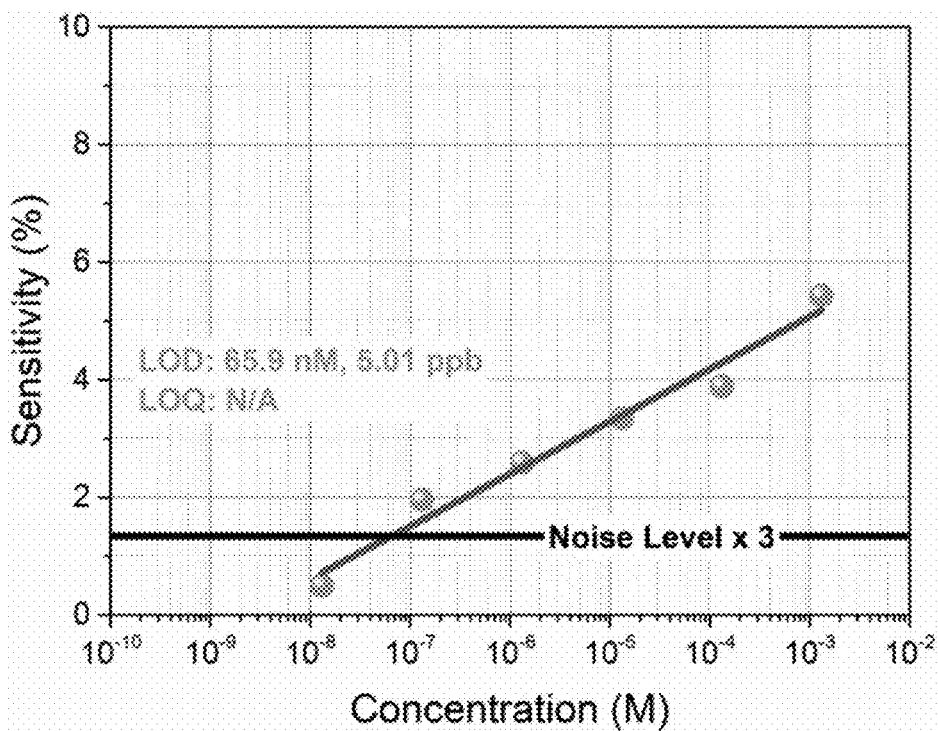
FIG. 22B shows PDVT-CS EGOFET calibration plot towards $SiO_3^{2-}$ in HEPES solution.
Figure 23A:
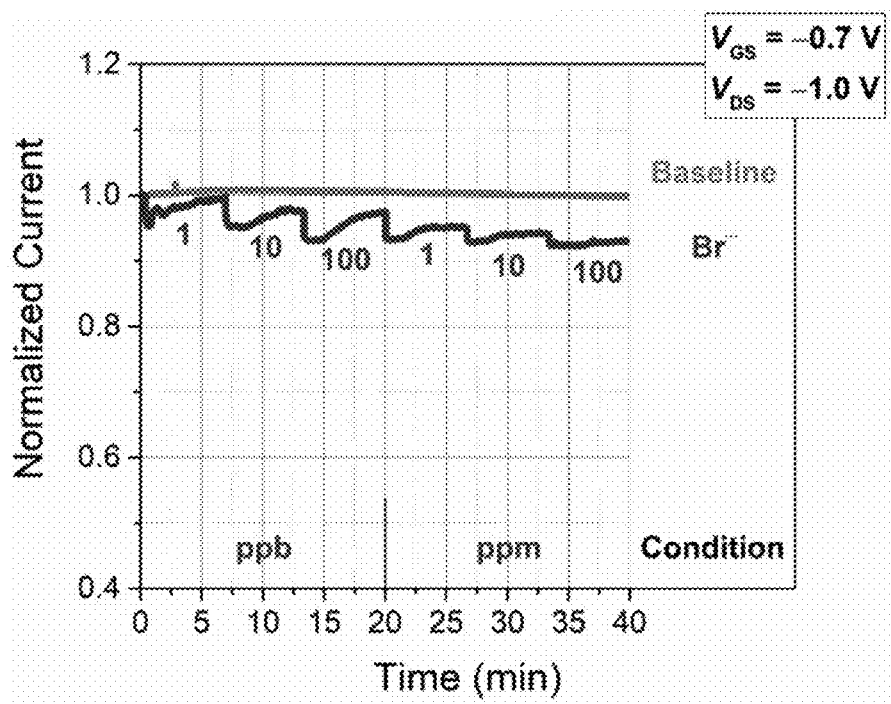
FIG. 23A shows PDVT-CS EGOFET transient responses (at $V_{GS}$=−0.7 V and $V_{DS}$=−1.0 V) towards bromide ($Br^-$) in HEPES solution.
Figure 23B:
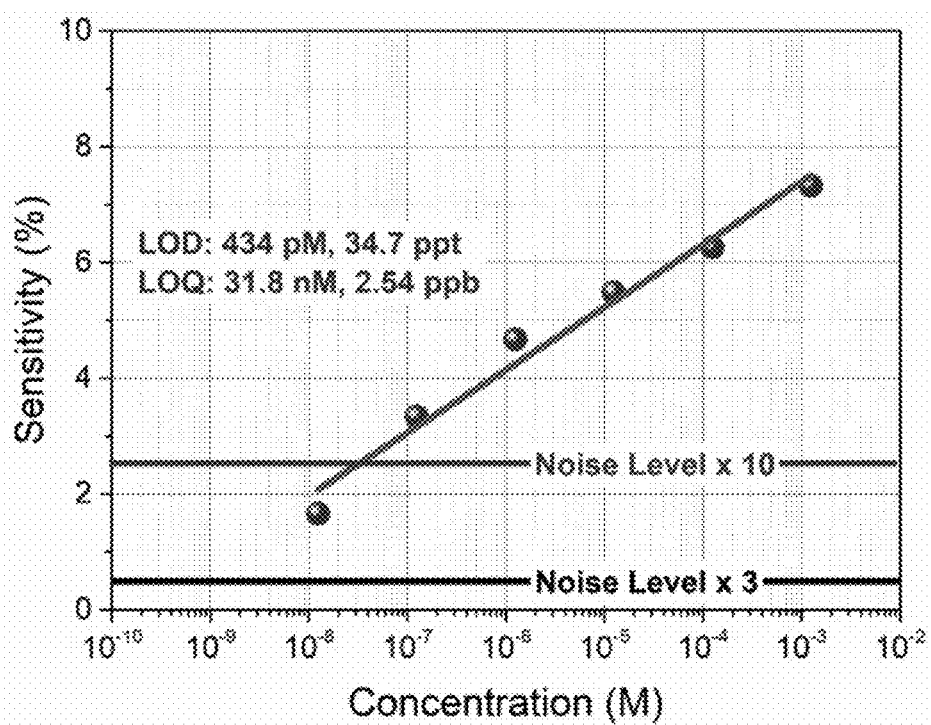
FIG. 23B shows PDVT-CS EGOFET calibration plot towards $Br^-$ in HEPES solution.
Figure 24A:
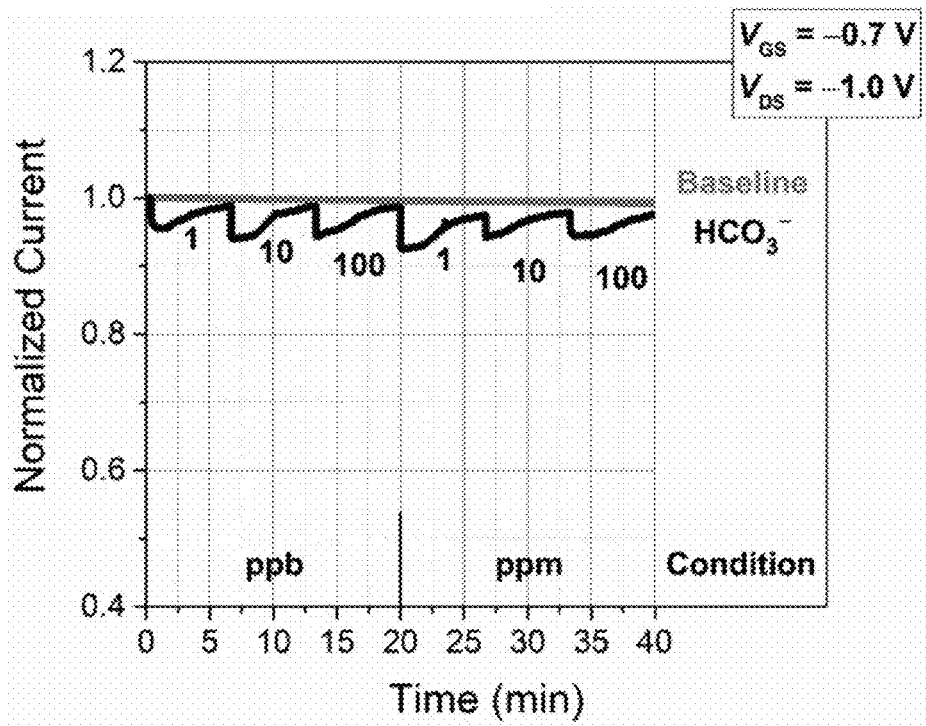
FIG. 24A shows PDVT-CS EGOFET transient responses (at $V_{GS}$=−0.7 V and $V_{DS}$=−1.0 V) towards bicarbonate ($HCO_3^-$) in HEPES solution.
Figure 24B:
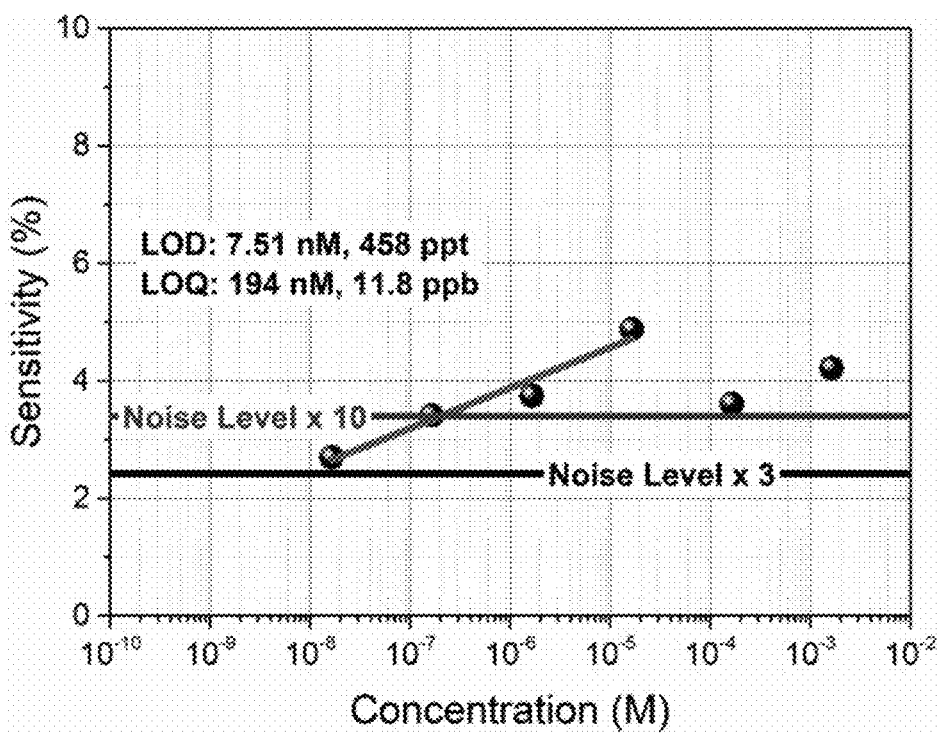
FIG. 24B shows PDVT-CS EGOFET calibration plot towards $HCO_3$ in HEPES solution.
Figure 25A:
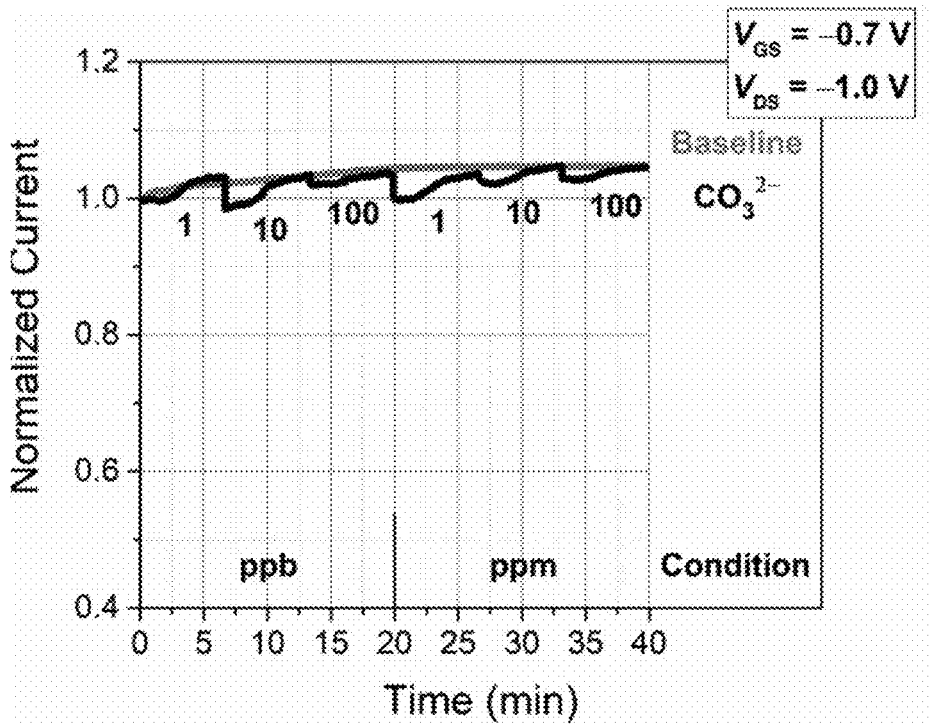
FIG. 25A shows PDVT-CS EGOFET transient responses (at $V_{GS}$=−0.7 V and $V_{DS}$=−1.0 V) towards carbonate ($CO_3^{2-}$) in HEPES solution.
Figure 25B:
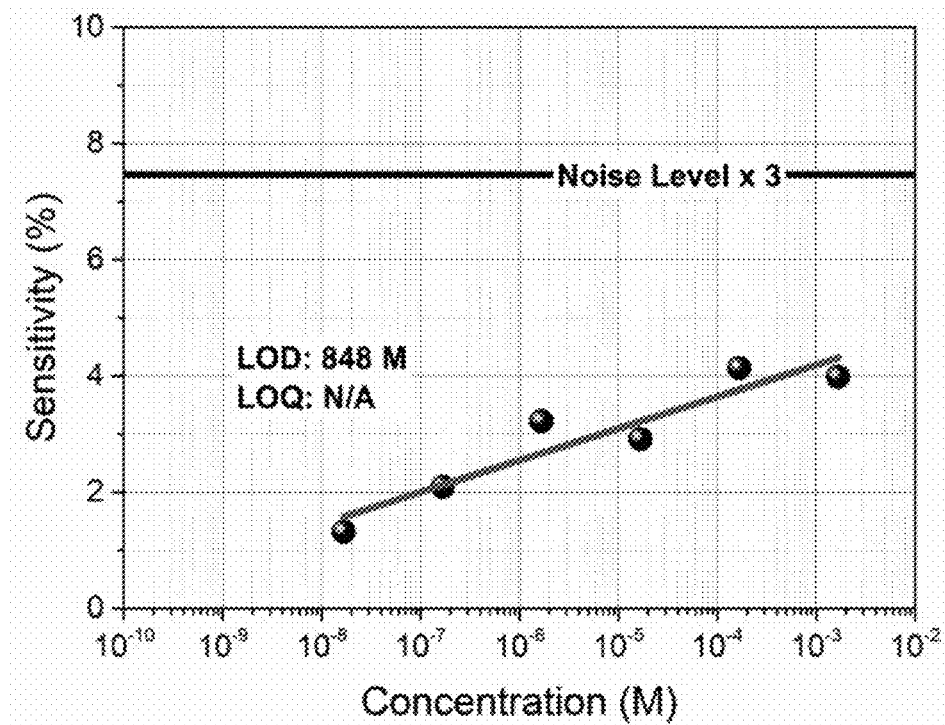
FIG. 25B shows PDVT-CS EGOFET calibration plot towards $CO_3^{2-}$ in HEPES solution.
Figure 26A:
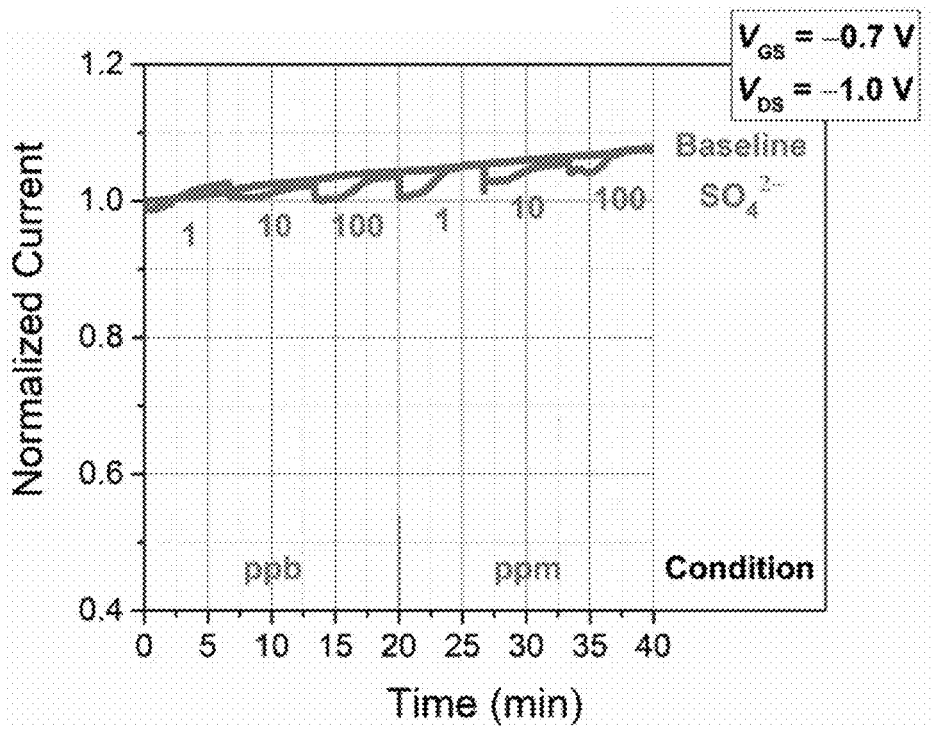
FIG. 26A shows PDVT-CS EGOFET transient responses (at $V_{GS}$=−0.7 V and $V_{DS}$=−1.0 V) towards sulfate ($SO_4^{2-}$) in HEPES solution.
Figure 26B:
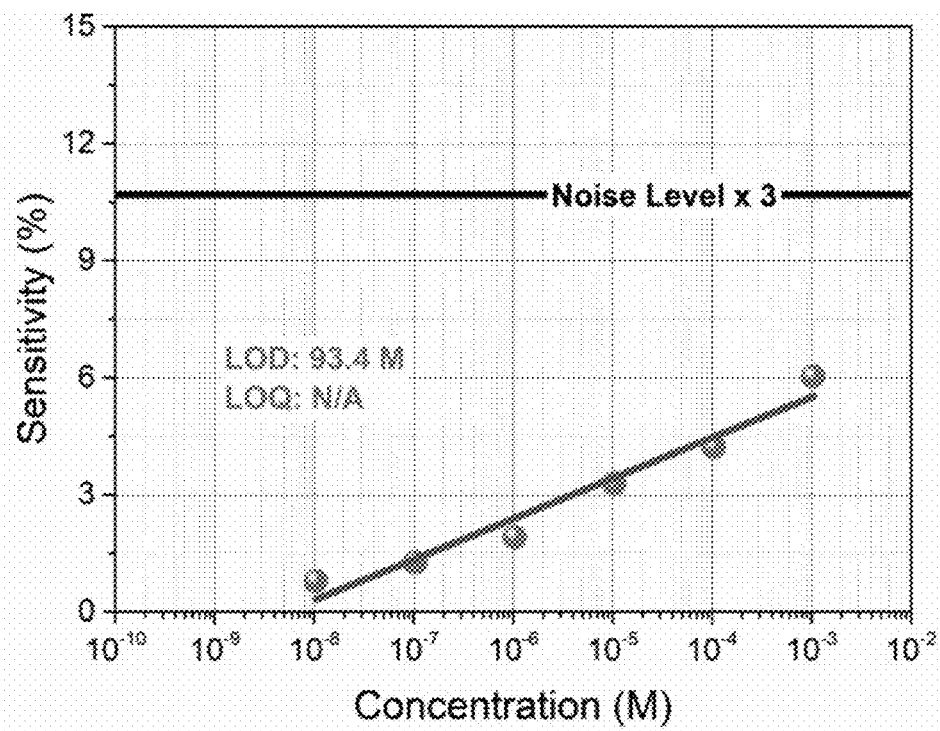
FIG. 26B shows PDVT-CS EGOFET calibration plot towards $SO_4^{2-}$ in HEPES solution.
Figure 27A:
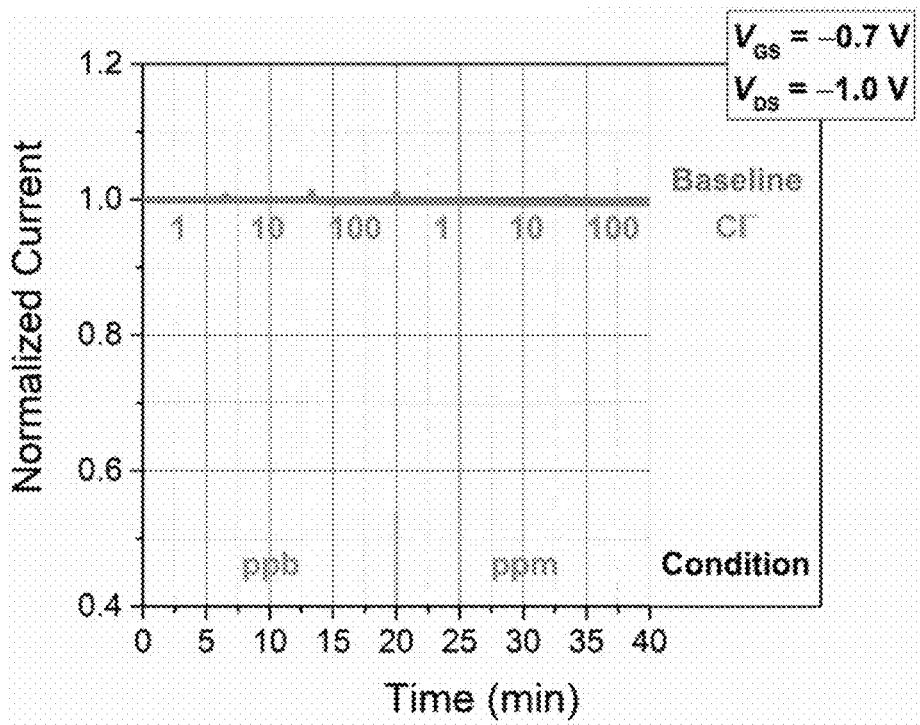
FIG. 27A shows PDVT-CS EGOFET transient responses (at $V_{GS}$=−0.7 V and $V_{DS}$=−1.0 V) towards chloride ($Cl^-$) in HEPES solution.
Figure 27B:
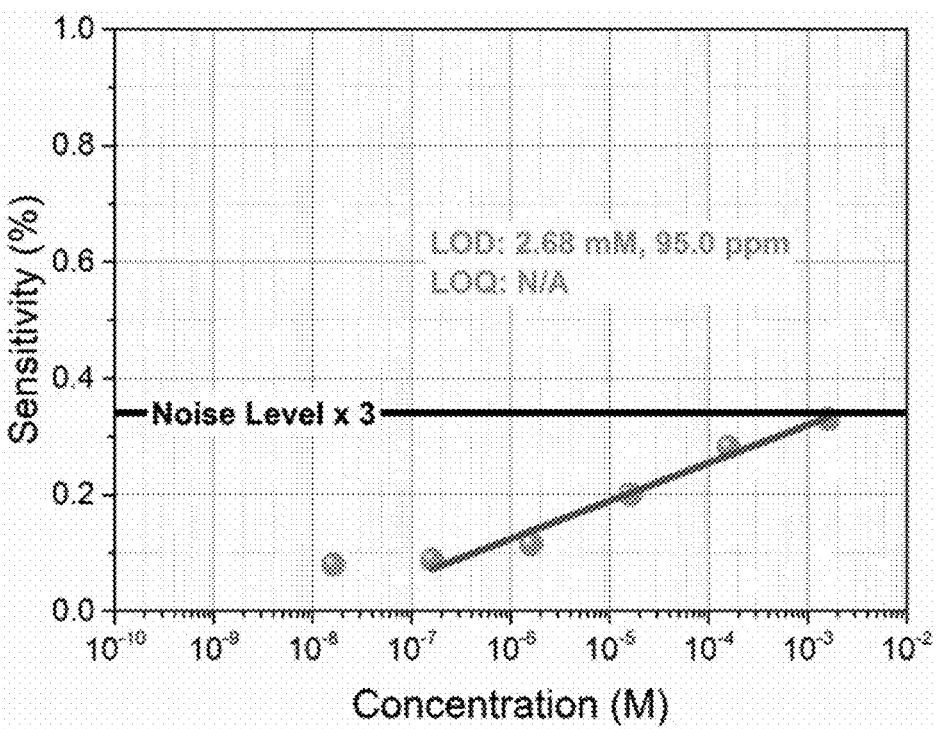
FIG. 27B shows PDVT-CS EGOFET calibration plot towards $Cl^-$ in HEPES solution.
Figure 28A:
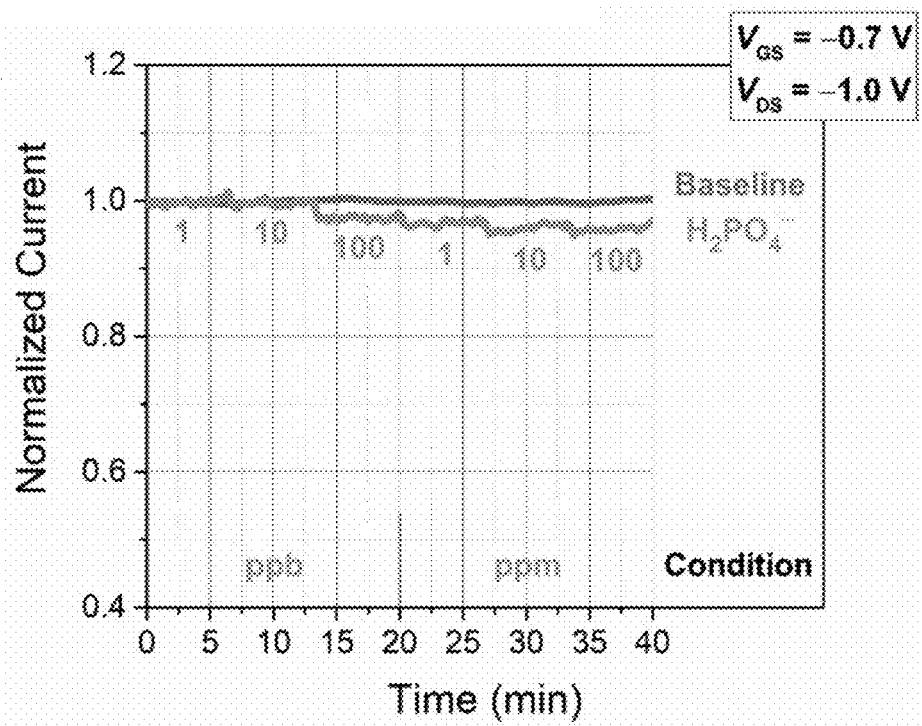
FIG. 28A shows PDVT-CS EGOFET transient responses (at $V_{GS}$=−0.7 V and $V_{DS}$=−1.0 V) towards $H_2PO_4^-$ in artificial seawater.
Figure 28B:
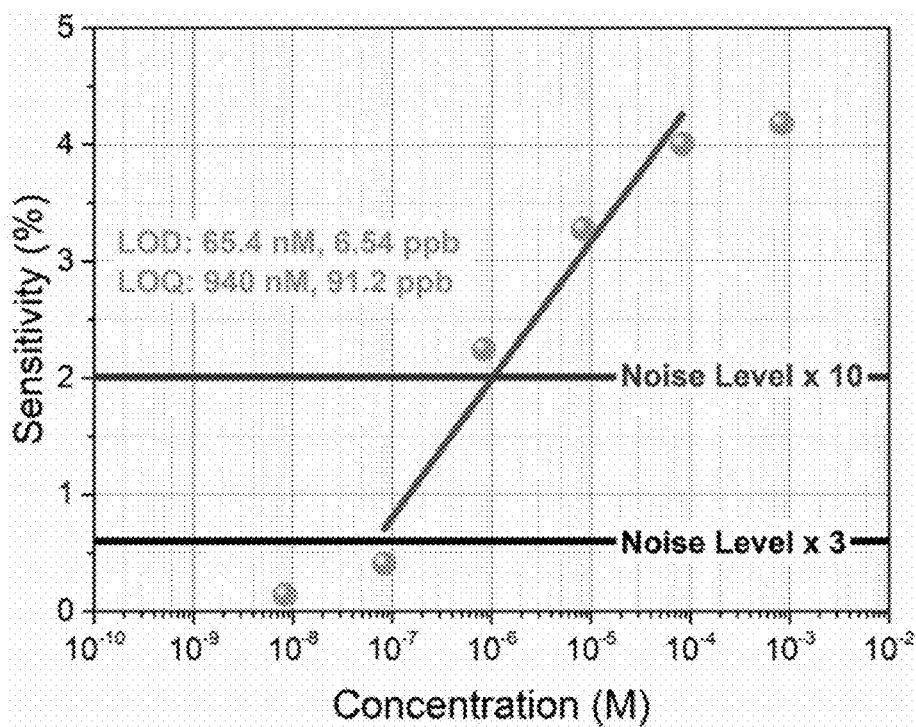
FIG. 28B shows PDVT-CS EGOFET a calibration plot towards $H_2PO_4^-$ in artificial seawater.
Figure 29:
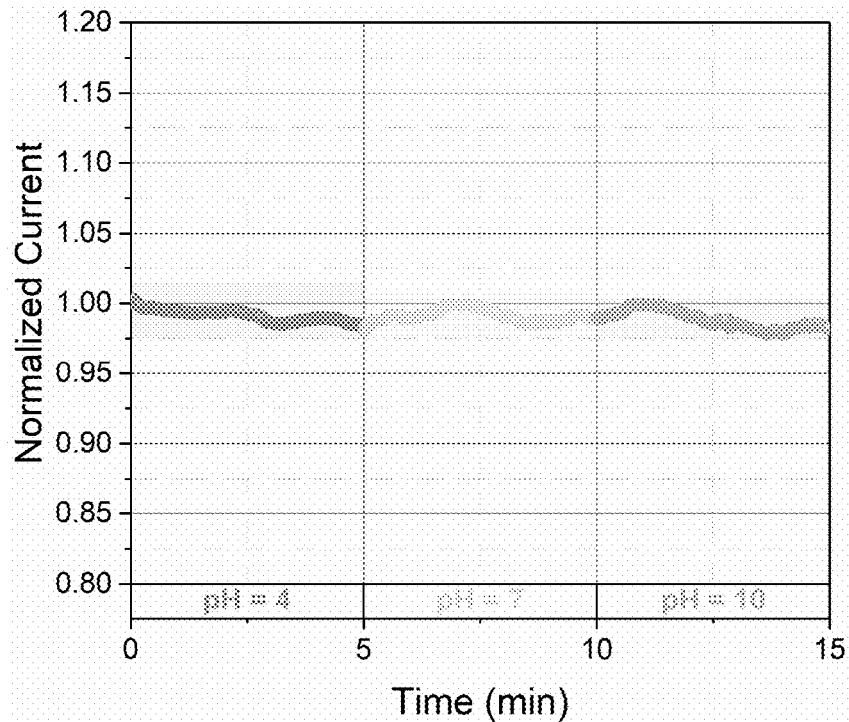
FIG. 29 shows PDVT-CS EGOFET transient responses (at $V_{GS}$=−0.7 V and $V_{DS}$=−1.0 V) towards pH fluctuations (4, 7, and 10).
Figure 30A:
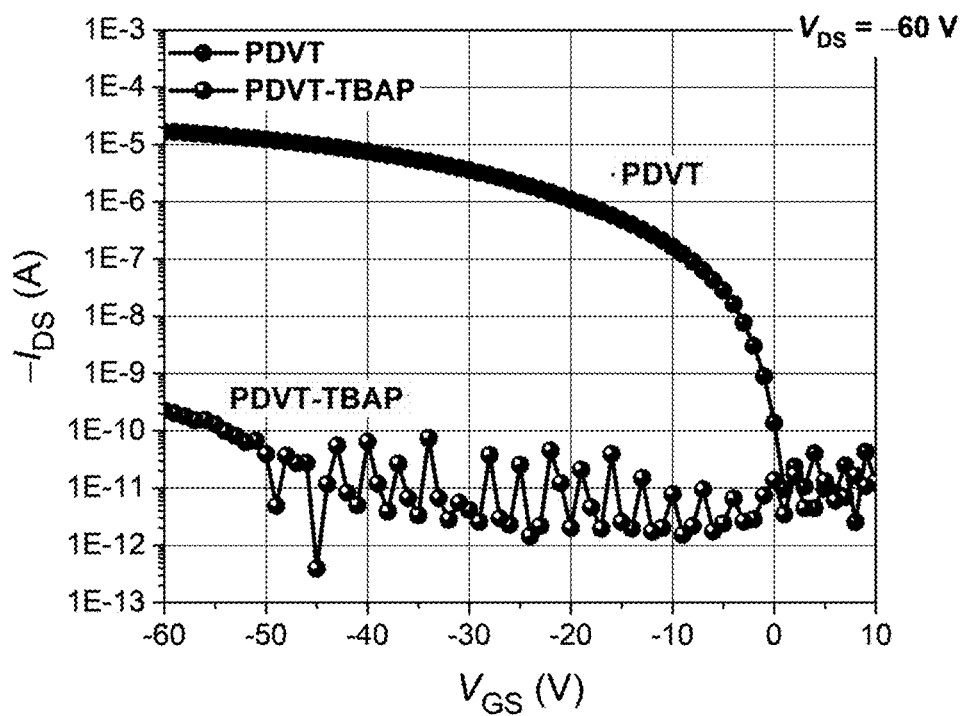
FIG. 30A shows PDVT-TBAP (without CS) transfer characteristics. These results show how the charge transport is affected by polymer-analyte interactions. In p-channel conduction mode the profiles show significant degradation.
Figure 30B:
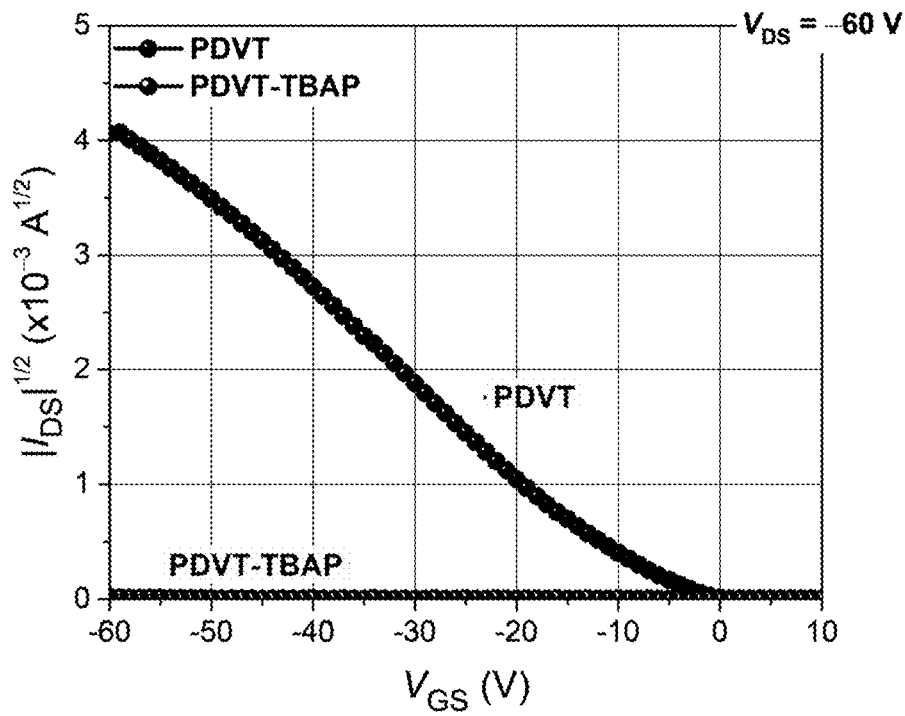
FIG. 30B shows PDVT-TBAP (without CS) transfer characteristics, wherein the vertical axis represent $$\sqrt{I_{DS}}.$$
Figure 30C:
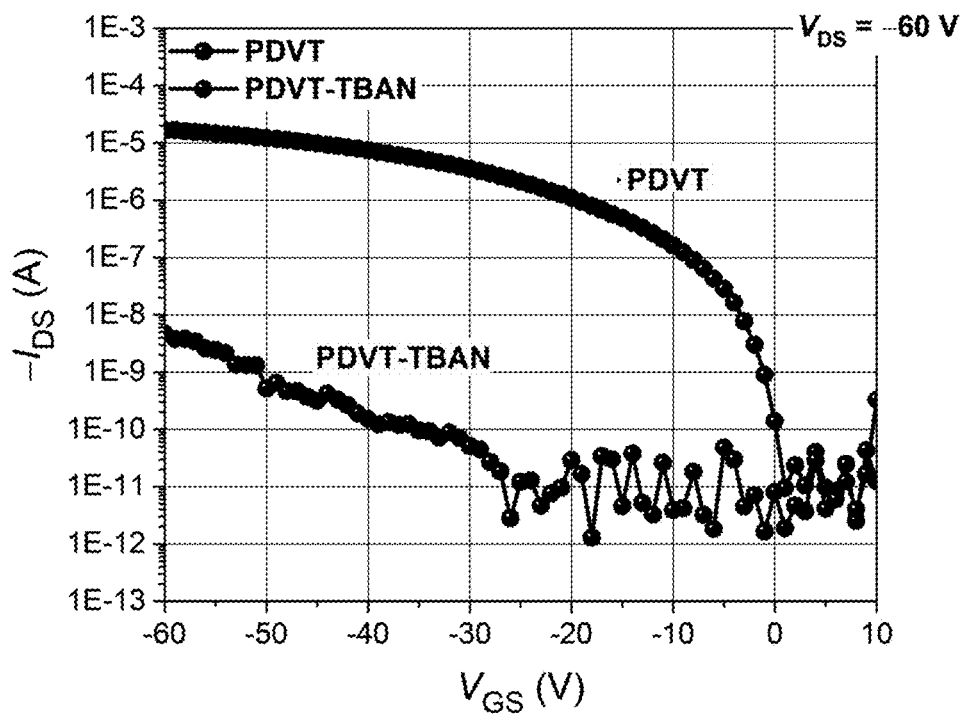
FIG. 30C shows PDVT-TBAN (without CS) transfer characteristics. These results show how the charge transport is affected by polymer-analyte interactions. In p-channel conduction mode the profiles show significant degradation.
Figure 30D:
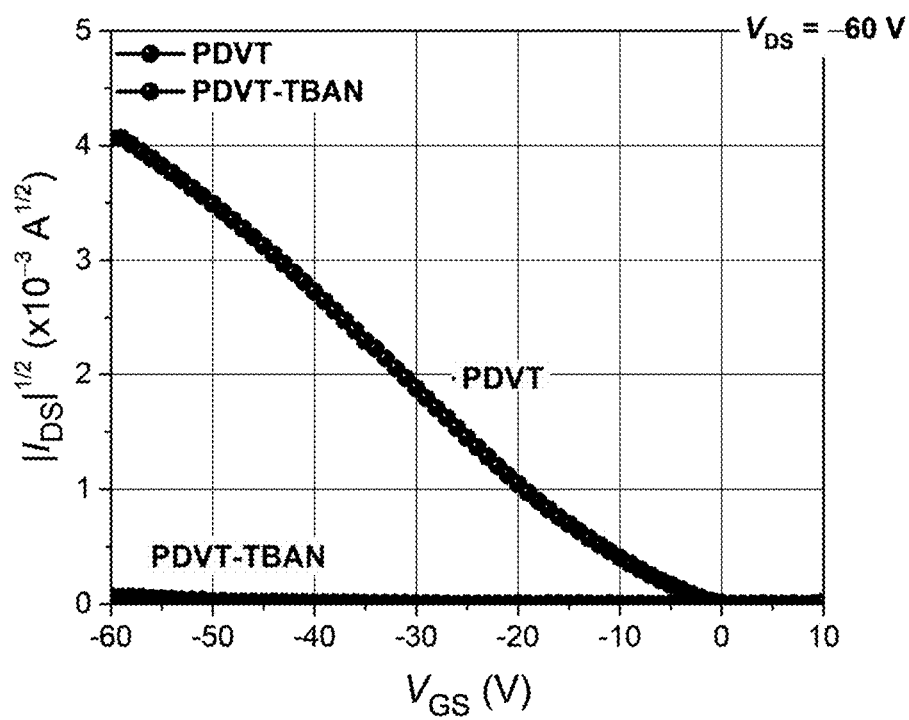
FIG. 30D shows PDVT-TBAN (without CS) transfer characteristics, wherein the vertical axis represent $$\sqrt{I_{DS}}.$$
Figure 31A:
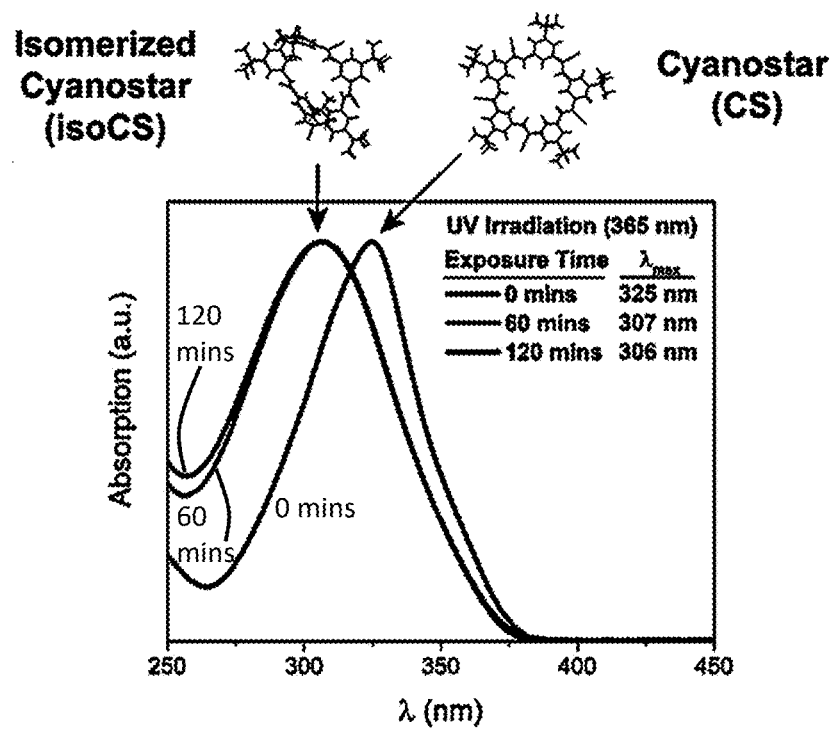
FIG. 31A shows the UV-Vis absorption spectra of CS undergoing photoisomerization in $CHCl_3$ solutions.
Figure 31B:
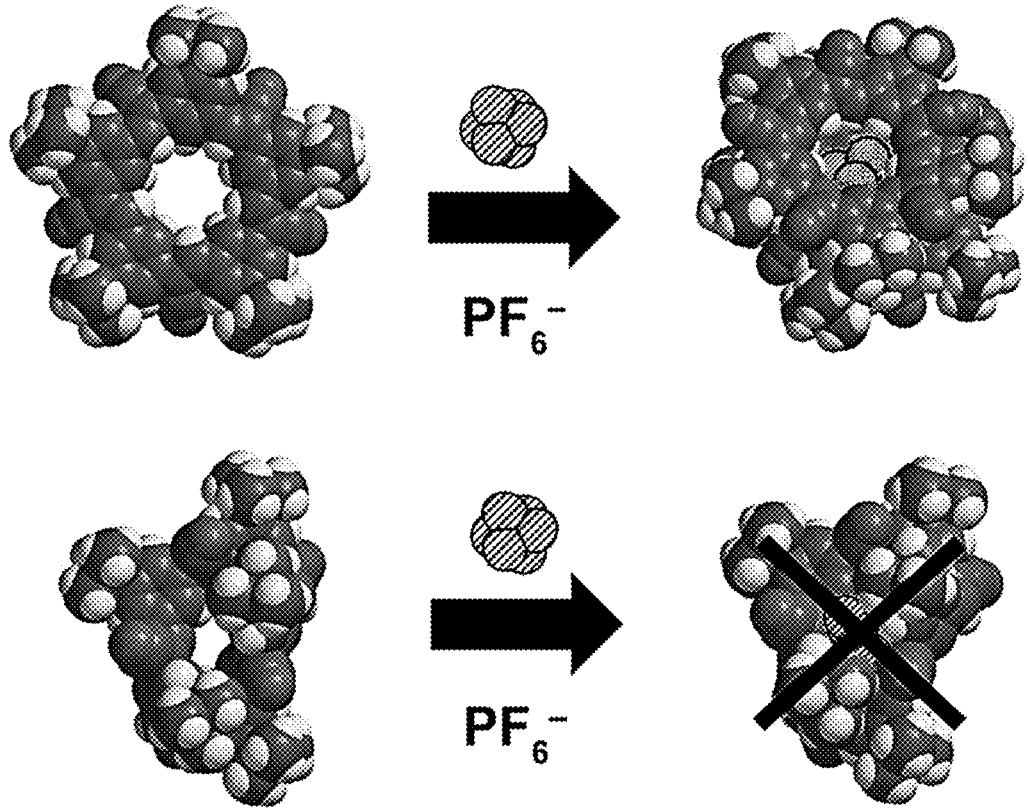
FIG. 31B illustrates the anion recognition properties of CS with the binding affinity altered by macrocycle conformation.
Figure 32A:
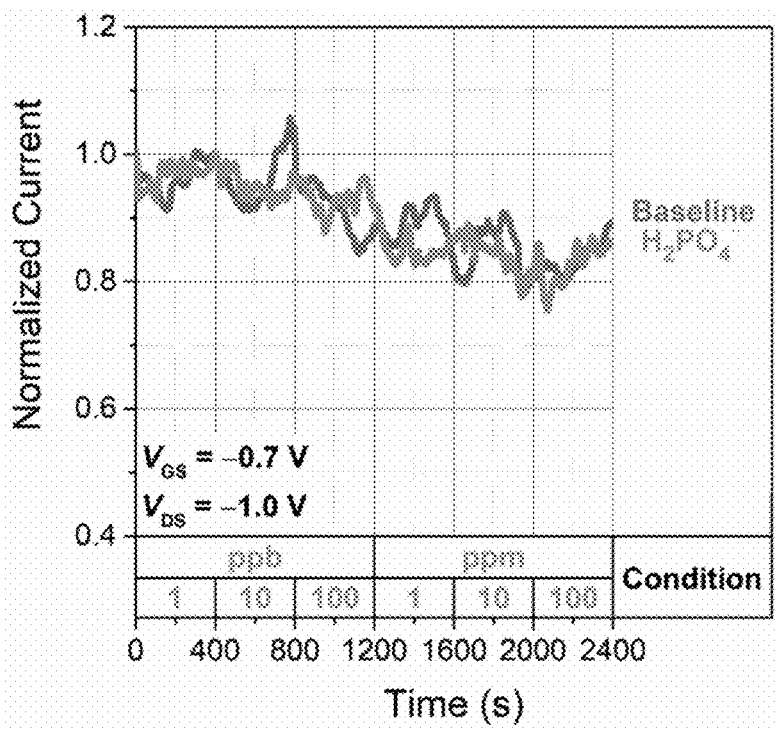
FIG. 32A shows PDVT-isoCS EGOFET transient responses (at $V_{GS}$=−0.7 V and $V_{DS}$=−1.0 V) towards $H_2PO_4^-$ in HEPES solution.
Figure 32B:
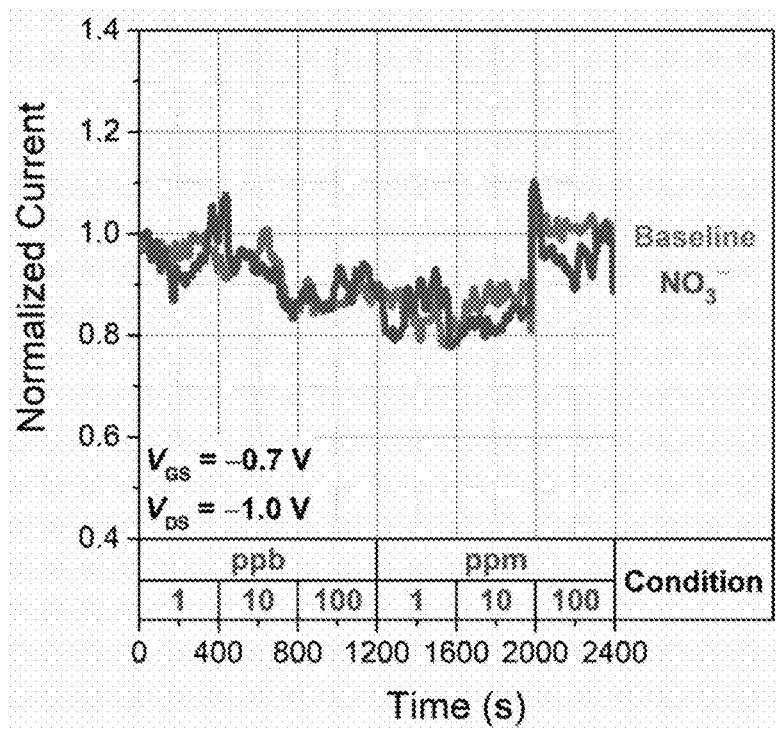
FIG. 32B shows PDVT-isoCS EGOFET transient responses (at $V_{GS}$=−0.7 V and $V_{DS}$=−1.0 V) towards $NO_3^-$ in HEPES solution.
Figure 32C:
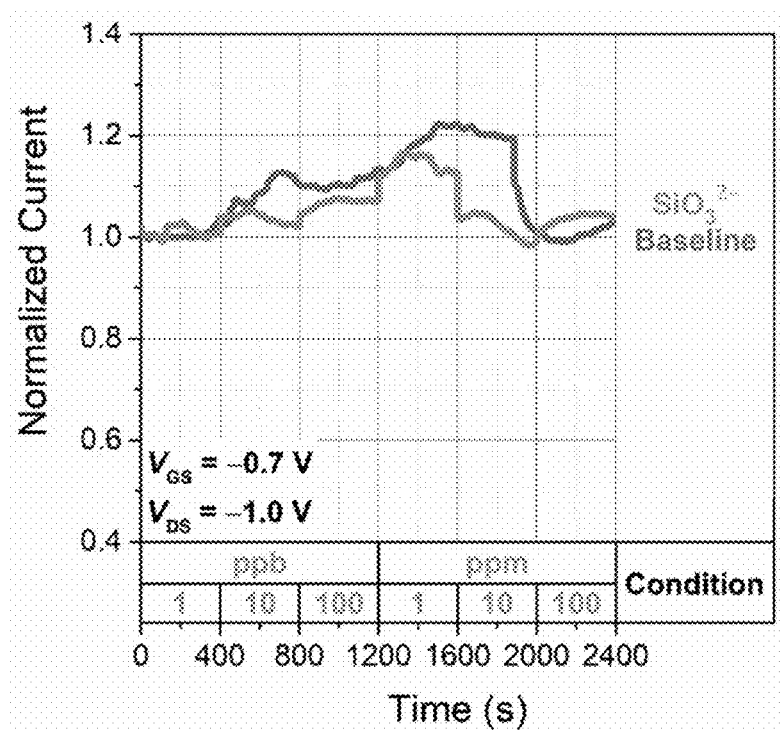
FIG. 32C shows PDVT-isoCS EGOFET transient responses (at $V_{GS}$=−0.7 V and $V_{DS}$=−1.0 V) towards $SiO_3^{2-}$ in HEPES solution.
Figure 32D:
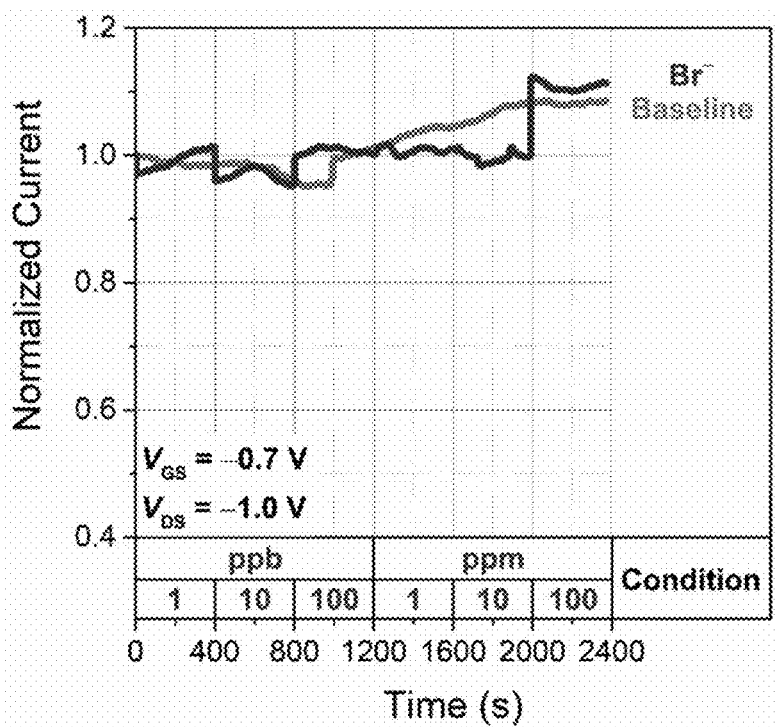
FIG. 32D shows PDVT-isoCS EGOFET transient responses (at $V_{GS}$=−0.7 V and $V_{DS}$=−1.0 V) towards Br in HEPES solution.
Figure 32E:
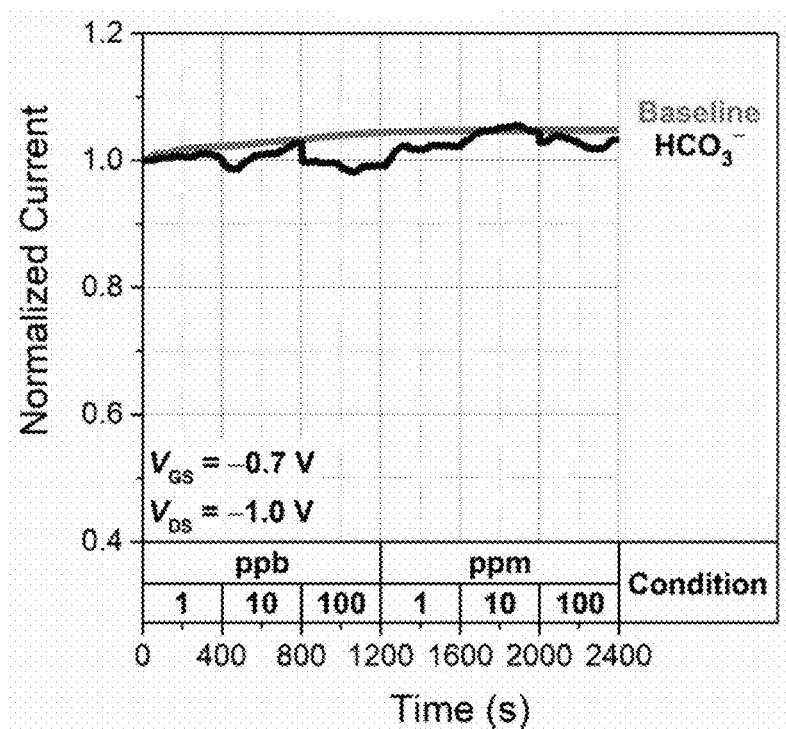
FIG. 32E shows PDVT-isoCS EGOFET transient responses (at $V_{GS}$=−0.7 V and $V_{DS}$=−1.0 V) towards $HCO_3^-$ in HEPES solution.
Figure 32F:
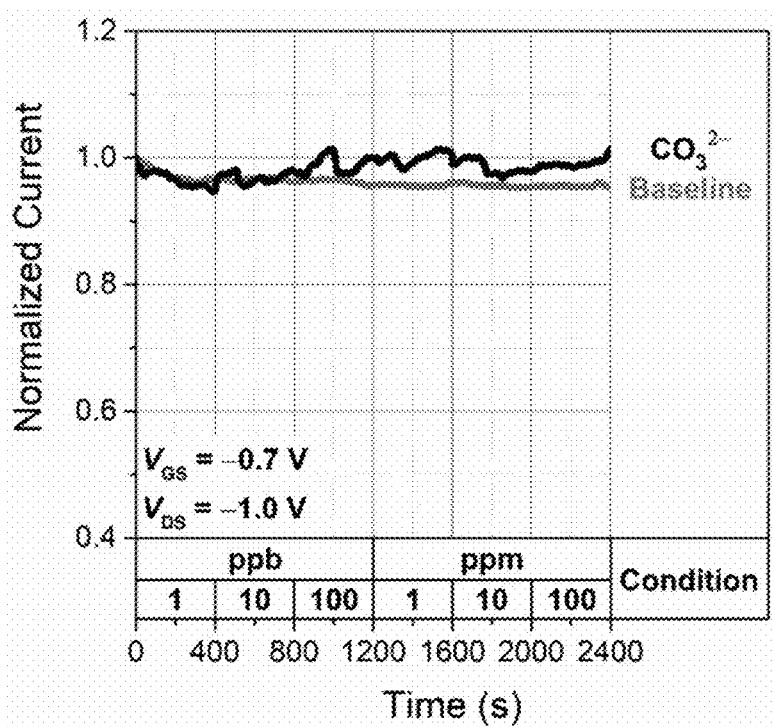
FIG. 32F shows PDVT-isoCS EGOFET transient responses (at $V_{GS}$=−0.7 V and $V_{DS}$=−1.0 V) towards $CO_3^{2-}$ in HEPES solution.
Figure 32G:
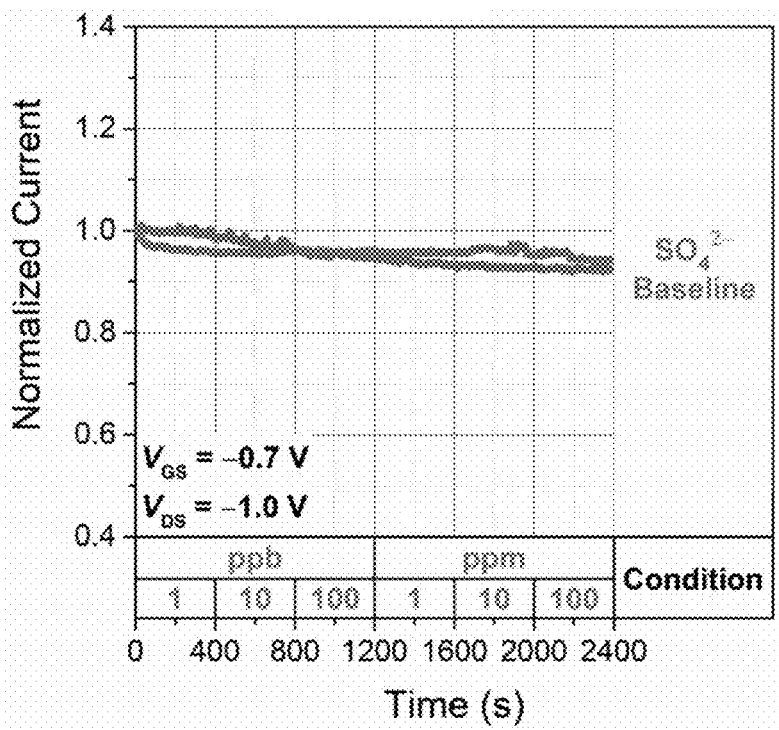
FIG. 32G shows PDVT-isoCS EGOFET transient responses (at $V_{GS}$=−0.7 V and $V_{DS}$=−1.0 V) towards $SO_4^{2-}$ in HEPES solution.
Figure 32H:
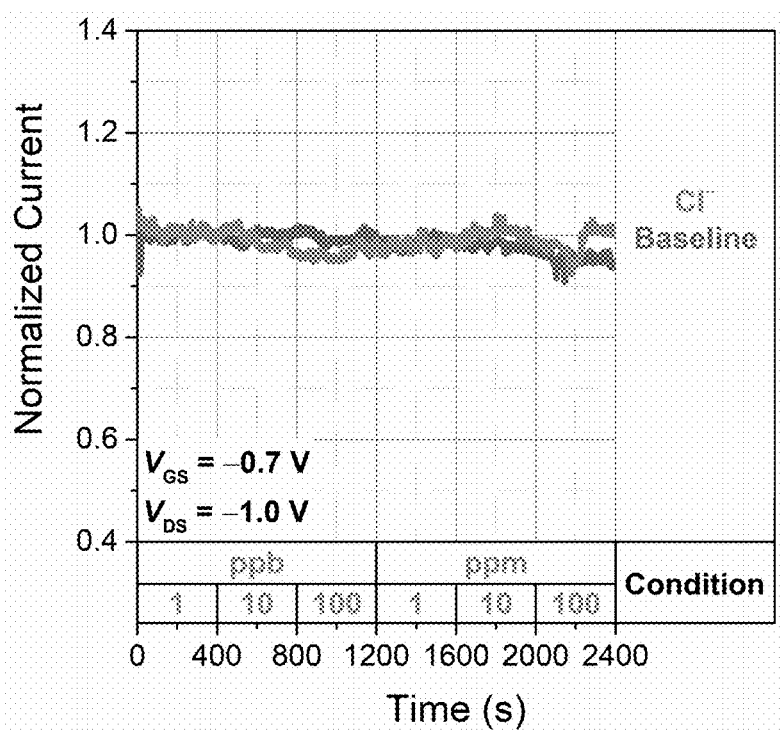
FIG. 32H shows PDVT-isoCS EGOFET transient responses (at $V_{GS}$=−0.7 V and $V_{DS}$=−1.0 V) towards $Cl^-$ in HEPES solution.

The present invention provides novel soft matter electronic devices that are prepared using straightforward processing methods resulting in highly sensitive, selective, and reproducible sensors for anions. Furthermore, this invention provides alternative methods utilizing organic semiconductors and macrocyclic molecules with tunable electrical properties for targeted sensing applications. The invention demonstrates a novel composite film transistor-based platform, that provides high selectivity and sensitivity in complex environments and in the presence of interfering ions.

The present invention provides several advantages when compared to traditional and contemporary sensing approaches involving both soft matter and inorganic materials systems. These include: 1) a method that overcomes challenges associated with OFET fabrication practices involving the use of 2-D materials, molecularly imprinted polymer (MIP) matrices, nanoparticles, aptamers, enzymes, and other biomacromolecules; 2) high sensitivity towards weakly coordinating anions; 3) sensors operating in deionized (DI) water and complex aqueous media; 4) a methodology that allows for the discrimination of analytes based on multifaceted analyte characteristics (molecule size, shape, and charge). The above advantages coupled with the synthetic tunability of organic semiconductors and macrocyclic receptor chemistries enables access to unique optoelectronic and sensing properties, providing significant potential for advancing anion sensing technologies, including but not limited to environmental and point-of-care medical diagnostics. In one aspect, the present disclosure relates to a semiconductor sensor device for the detection of anionic molecules. The device includes a semiconductor layer comprising one or more films, comprising one or more organic molecules, and one or more receptor molecules (probe), comprising a poly-cyanostilbene macrocycle according to Formula I:

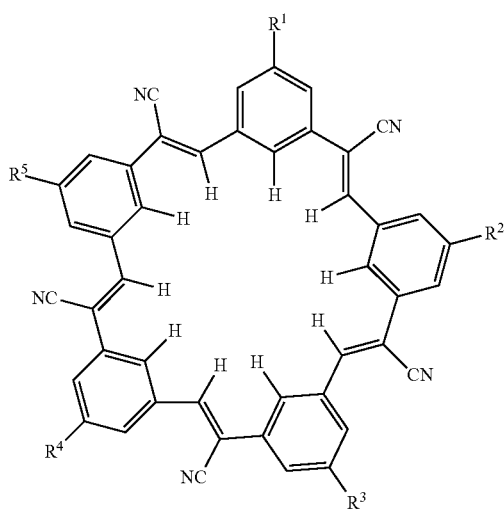

wherein $R^1$, $R^2$, $R^3$, $R^4$, and $R^5$ are each independently selected from the group consisting of a hydrocarbyl group comprising from 1 to 30 carbon atoms or from about 2 to 20 carbon atoms or from about 2 to 10 carbon atoms, an alkenyl group comprising from 2 to 30 carbon atoms, or from about 2 to 20 carbon atoms, or from about 2 to 10 carbon atoms, an alkyl group comprising from 2 to 30 carbon atoms, or from about 2 to 20 carbon atoms, or from about 2 to 10 carbon atoms, an alkoxy group comprising from 1 to 30 carbon atoms, or from about 1 to 20 carbon atoms, or from about 1 to 10 carbon atoms, an aryl group comprising from 6 to 20 carbon atoms, or from about 6 to 12 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, $-(CH_2)_{1-20}-NH-(CH_2)_{1-20}-CH_3$, ethynyl, arylethynylene, hydrogen, -halo, $-OR^9$, $-N(R^{10}R^{11})$, $-CO_2R^{12}$, $-C(O)-N(R^{13}R^{14})$ wherein $R^9$, $R^{10}$, $R^{11}$, $R^{12}$, $R^{13}$, and $R^{14}$ are each independently selected from the group consisting of an alkenyl group comprising from 2 to 20 carbon atoms, an alkyl group comprising from 2 to 20 carbon atoms, an alkoxy group comprising from 2 to 20 carbon atoms, $-(CH_2)_{1-20}-NH-(CH_2)_{1-20}-CH_3$, an aryl group comprising from 6 to 20 carbon atoms, an arylalkyl group comprising from 7 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, and hydrogen, wherein the one or more receptors is embedded within or onto the semiconducting layer.

The one or more organic molecules of the semiconductor sensor device may be small molecules, having a molecular weight of from about 50 g/mol to about 5,000 g/mol, as measured by gel permeation chromatography and NMR. Suitable examples of small organic molecules may be tetracene, pentacene, naphthalene diimide, and phthalocyanine.

The one or more organic molecules of the semiconductor sensor device may be oligomers having repeating units (n) of integer values between about 2 and 14, and a molecular weight of from about 300 g/mol to about 10,000 g/mol. Suitable examples of oligomer organic molecules may be selected from 1H-pyyrole, 3-4-ethylenedioxythiophene, 9H-fluorene, and p-phenylene.

The one or more organic molecules of the semiconductor sensor device may be polymers with repeating units (n) of integer values ≥15, or greater than 20, or greater than 30 or greater than 50, and a molecular weight from about 15,000 g/mol to about 500,000 g/mol.

For example, the one or more organic molecules may include a conjugated polymer according to Formula (II):

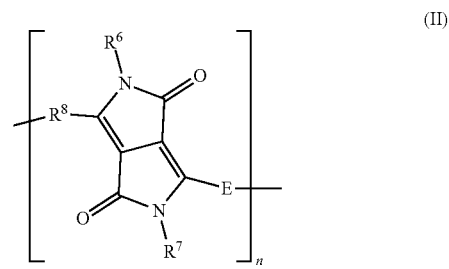

wherein E represents an "electron donating group", $R^6$ and $R^7$ are each independently selected from a hydrocarbyl group comprising from 1 to about 50 carbon atoms, or from about 1 to 30 carbon atoms, $R^8$ may be a hydrocarbyl group comprising from 1 to about 20 carbon atoms, or a thiophene group, and n may be an integer of greater than 15.

The term "electron donating group" refers to a group that has the net effect of increasing electron density in a molecule through a carbon atom it is bonded to via inductive or resonance effects. Exemplary electron donating groups include thiophene groups ($C_4H_4S$), ether groups (e.g., $-O-$), hydroxyl groups (e.g., $-OH$), amine groups (e.g., $-NH_2$, $-NR^9$, etc.), arene groups (e.g., phenyl), and $C_1$-$C_{20}$ hydrocarbyl groups (e.g. $-CH_3$), wherein $R^9$ may be a hydrocarbyl group comprising from 1 to 20 carbon atoms. For example, the electron donating group may comprise of one or more thiophene groups, or two or more thiophene groups, or three or more thiophene groups, or a polythiophene according to the following structure:

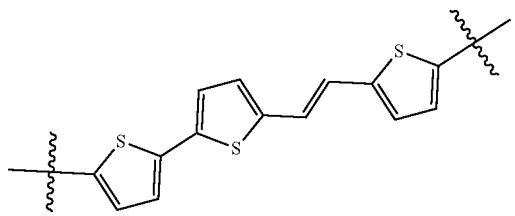 [SMILES: *c1ccc(/C=C/c2ccc(-c3ccc(*)s3)s2)s1]

Suitable examples of polymeric organic molecules may include poly[[2,5-bis(2-decyltetradecyl)-2,3,5,6-tetrahydro-3,6-dioxopyrrolo[3,4-c]pyrrole-1,4-diyl][2,2'-bithiophene]-5,5'-diyl-(1E)-1,2-ethenediyl[2,2'-bithiophene]-5,5'-diyl] (PDVT), poly[2,5-(2-octyldodecyl)-3,6-diketopyrrolopyrrole-alt-5,5-(2,5-di(thien-2-yl)thieno[3,2-b]thiophene)](DPP-DTT), poly[2,5-bis(2-octyldodecyl)pyrrolo[3,4-c]pyrrole-1,4(2H,5H)-dione-3,6-diyl)-alt-(2,2'; 5',2";5",2'''-quaterthiophen-5,5'''-diyl)](DPP-4T), poly(3-hexylthiophene-2,5-diyl) (P3HT), and poly(3,4-ethylenedioxythiophene)-poly(styrenesulfonate) (PEDOT:PSS).

The one or more organic molecules may be reticular chemistries, having small organic molecules connected by linkages consisting of boroxine, imine, hydrazone, azine, and ketoenamine.

The two or more organic molecules may be the same or different. Sometimes, two or more organic molecules are the same. Sometimes, the two or more organic molecules are different.

The one or more receptors (probes) may be a polycyanostilbene macrocycle, called cyanostar, according to the Formula (I):

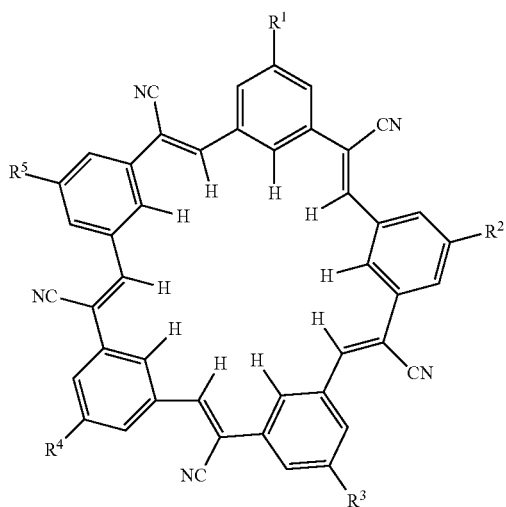

wherein $R^1$, $R^2$, $R^3$, $R^4$, and $R^5$ are each independently selected from the group consisting of an alkenyl group comprising from 2 to 30 carbon atoms, or from about 2 to 20 carbon atoms, or from about 2 to 10 carbon atoms, an alkyl group comprising from 2 to 30 carbon atoms, or from about to 20 carbon atoms, or from about 2 to 10 carbon atoms, alkoxy group comprising from 1 to 30 carbon atoms, or from about 1 to 20 carbon atoms, or from about 1 to 10 carbon atoms, an aryl group comprising from 6 to 20 carbon atoms, or from about 6 to 12 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, —$(CH_2)_{1\text{-}20}$—NH—$(CH_2)_{1\text{-}20}$—$CH_3$, ethynyl, arylethynylene, hydrogen, -halo, —$OR^9$, —$N(R^{10}R^{11})$, —$CO_2R^{12}$, —C(O)—$N(R^{13}R^{14})$, wherein $R^9$, $R^{10}$, $R^{11}$, $R^{12}$, $R^{13}$, and $R^{14}$ are each independently selected from the group consisting of alkenyl group comprising from 2 to 20 carbon atoms, alkyl group comprising from 2 to 20 carbon atoms, alkoxy group comprising from 2 to 20 carbon atoms, —$(CH_2)_{1\text{-}20}$—NH—$(CH_2)_{1\text{-}20}$—$CH_3$, aryl group comprising from 6 to 20 carbon atoms, arylalkyl group comprising from 7 to 20 carbon atoms, cycloalkyl group comprising from 4 to about 20 carbon atoms, heteroaryl group comprising from 5 to 20 carbon atoms, heterocycle group comprising from 3 to about 20 carbon atoms, haloalkyl group comprising from 1 to 20 carbon atoms, and hydrogen. $R^1$, $R^2$, $R^3$, $R^4$, and $R^5$ may each be a tert-butyl substituent group.

The one or more receptors may be any shape-persistent macrocycle. The one or more receptor molecules may include two or more receptor molecules, wherein the two or more receptor molecules are the same or different. Sometimes, the two or more receptor molecules are the same. Sometimes, the two or more receptor molecules are different.

The device of the foregoing embodiments may include a two-terminal chemiresistor including a source and a drain electrode with a chemically sensitive semiconductor material comprising a channel. The device may operate through a change in electrical resistance of the semiconductor material interacting with a target molecule. Devices may include variable channel lengths and channel widths with either linear or interdigitated electrode patterns, wherein the length ranges from 1 μm-10 mm and the width ranges from 100 μm-50 mm.

The device of the foregoing embodiments may include a three-terminal transistor including a source, a drain, and an insulated gate electrode configured to enhance the electrical conductivity of a chemically sensitive semiconductor material, resulting in greater signal amplification in response to an interacting or absorbed target molecule. The devices can include variable channel lengths and channel widths with either linear or interdigitated electrode patterns. The devices can include top-gate, bottom-gate, and extended-gate configurations. The devices can operate in either accumulation or depletion mode.

The device of the foregoing embodiments may include of a three-terminal transistor including a source and drain electrode in conjunction with a gate electrode and a chemically sensitive semiconductor material in direct contact with an electrolyte. The gate voltage can be controlled through the contributions of a reference and counter electrode while the source and drain voltage can be applied via an external source-meter unit. The devices can include variable channel lengths and channel widths with either linear or interdigitated electrode patterns. The devices can operate in either accumulation or depletion mode.

The device of the foregoing embodiments may include a collinear four-terminal device configurations to measure the change in electrical resistance in response to an interacting or absorbed target molecule.

In a second aspect, the present disclosure relates to a method for fabricating the foregoing embodiments of the semiconductor sensor device for the detection of anionic molecules. Various solution-processing methods may be employed to create layers which are comprised of a mixture or layers of semiconducting materials and the one or more organic molecules between two or more collinear electrodes and in proximity to one or more gate electrodes. The fabrication protocol includes the coupling of one or more receptor molecules into or onto the semiconducting layer, dielectric surface, or electrode surface, wherein the dielectric surface corresponds to the floor of the semiconductor sensor device, near the back gate, as depicted in FIG. 1.

The semiconductor sensor device may be fabricated such that the one or more receptor molecules and the one or more organic molecules are within the same layer of the device. The device may also be fabricated such that the one or more receptor molecules and the one or more organic molecules are in different layers of the device.

The one or more receptor molecules of the foregoing embodiments may be chemically incorporated into the organic molecule(s) via chemical reaction throughout the same layer or the one or more receptor molecules may be chemically incorporated onto the surface of a separate layer containing the one or more organic molecules, or the one or more receptor molecules may be chemically incorporated onto the surface of a dielectric surface via chemical reaction throughout the same layer or by establishment of well-ordered films via physical vapor deposition, or the one or more receptor molecules may be chemically incorporated onto the surface of an electrode via chemical reaction throughout the same layer.

In each of the foregoing embodiments, the one or more receptor molecules may be physically entrapped in the organic film formed by the one or more organic molecules.

The semiconductor sensor device may have layers ranging from a monolayer to a thickness of <500 nm, or a thickness of >500 nm to <10 μm, as measured by profilometry or atomic force microscopy (AFM).

The one or more receptors and the one or more organic molecules may form the semiconducting layer of the sensor device which may be deposited via spin-coating, drop-casting, dip-coating, slot-die coating, doctor blading, and bar coating. The semiconducting layers may be optimized via post-deposition techniques such as solvent-vapor, thermal annealing, and crosslinking.

In a third aspect, the present disclosure relates to a chemical sensor system for the detection of anions in real-world samples (medical, environmental, high ionic strength, aqueous, threat, etc.). The sensor system at least comprises a sensor device, a sample, an assay system, a digital read-out, and a data processing system. The sensor device includes one or more transistors, each of the transistors including a conductive channel. The channel comprises a semiconducting film comprising one or more organic molecules and one or more receptor molecules, comprising a poly-cyanostilbene macrocycle according to Formula (I):

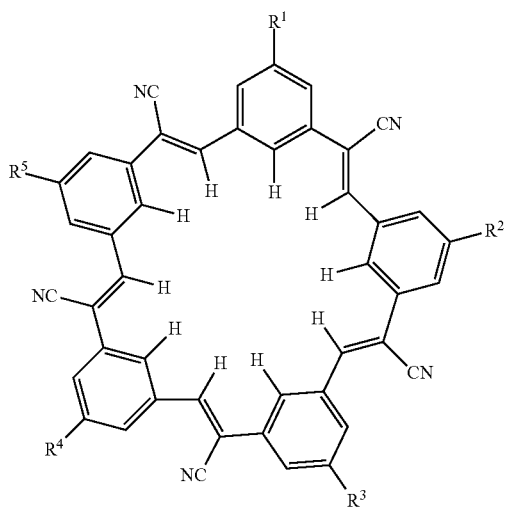

wherein $R^1$, $R^2$, $R^3$, $R^4$, and $R^5$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclyl group comprising from 3 to about 20 carbon atoms, a haloalkyl group comprising from 1 to 20 carbon atoms, $—(CH_2)_{1-20}—NH—(CH_2)_{1-20}—CH_3$, hydrogen, ethynyl, arylethynylene, halo, $—OR^9$, $—N(R^{10}R^{11})$, $—CO_2R^{12}$, $—C(O)—N(R^{13}R^{14})$, wherein $R^9$, $R^{10}$, $R^{11}$, $R^{12}$, $R^{13}$, and $R^{14}$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, $—(CH_2)_{1-20}—NH—(CH_2)_{1-20}—CH_3$, hydrogen, The sample is capable of holding a target molecule that is configured to bind with one or more of the probe molecules (receptors). The assay system is configured to bring the sensor device in contact with the sample.

The one or more receptor molecules and one or more organic molecules enhances the electronic properties of the semiconductor. The semiconducting device of the chemical sensor system operates via chemical doping of the semiconducting layer upon interaction with the analyte or via chemical dedoping of the semiconducting layer upon interaction with the analyte.

The chemical sensor system of the foregoing embodiments may detect a single analyte, or the system is capable of detecting multiple analytes of different chemical identities and classifications.

The chemical sensor system of the foregoing embodiments may comprise of one or more semiconductor devices, or two or more semiconductor devices, or three or more semiconductor devices, or a plurality of semiconductor devices.

The chemical sensor system of the foregoing embodiments may be exposed to water-based media for measuring one or multiple chemical properties. Suitable examples of the water-based media may be environmental water with varying levels of salinity, nutrients, pollutants, biological components, and any other living or nonliving species. The water-based media may include biological water originating from living organisms with varying levels of salinity, nutrients, pollutants, biological components, and any other living or nonliving species.

The chemical sensor system of the foregoing embodiments may further include a microfluidic system which may be coupled to the one or more semiconducting device(s), wherein the chemical sensor system is capable of electrically isolating said semiconducting layer components from remaining components of said devices.

The chemical sensor system of the foregoing embodiments may include a microfluidic network which is configured to direct multiple samples to individual devices for parallel analysis.

All patents and publications cited herein are fully incorporated by reference herein in their entirety or at least for the portion of their description for which they are specifically cited or relied upon in the present description.

The patentees do not intend to dedicate any disclosed embodiments to the public, and to the extent any disclosed modifications or alterations may not literally fall within the scope of the claims, they are considered to be part hereof under the doctrine of equivalents.

It is to be understood that each component, compound, substituent or parameter disclosed herein is to be interpreted as being disclosed for use alone or in combination with one or more of each and every other component, compound, substituent or parameter disclosed herein.

It is also to be understood that each amount/value or range of amounts/values for each component, compound, substituent or parameter disclosed herein is to be interpreted as also being disclosed in combination with each amount/value or range of amounts/values disclosed for any other component(s), compounds(s), substituent(s) or parameter(s) disclosed herein and that any combination of amounts/values or ranges of amounts/values for two or more component(s), compounds(s), substituent(s) or parameters disclosed herein are thus also disclosed in combination with each other for the purposes of this description.

It is further understood that each range disclosed herein is to be interpreted as a disclosure of each specific value within the disclosed range that has the same number of significant digits. Thus, a range of from 1-4 is to be interpreted as an express disclosure of the values 1, 2, 3 and 4.

It is further understood that each lower limit of each range disclosed herein is to be interpreted as disclosed in combination with each upper limit of each range and each specific value within each range disclosed herein for the same component, compounds, substituent, or parameter. Thus, this disclosure to be interpreted as a disclosure of all ranges derived by combining each lower limit of each range with each upper limit of each range or with each specific value within each range, or by combining each upper limit of each range with each specific value within each range.

Furthermore, specific amounts/values of a component, compound, substituent or parameter disclosed in the description or an example is to be interpreted as a disclosure of either a lower or an upper limit of a range and thus can be combined with any other lower or upper limit of a range or specific amount/value for the same component, compound, substituent or parameter disclosed elsewhere in the application to form a range for that component, compound, substituent or parameter.

REFERENCES

The following references may be useful in understanding some of the principles discussed herein:

1. Inganas, O., Organic Photovoltaics over Three Decades. *Adv. Mater.* 2018, 30 (35), e1800388.
2. Zheng, H.; Zheng, Y.; Liu, N.; Ai, N.; Wang, Q.; Wu, S.; Zhou, J.; Hu, D.; Yu, S.; Han, S.; Xu, W.; Luo, C.; Meng, Y.; Jiang, Z.; Chen, Y.; Li, D.; Huang, F.; Wang, J.; Peng, J.; Cao, Y., All-solution processed polymer light-emitting diode displays. *Nat. Commun.* 2013, 4, 1971.
3. Lee, Y. H.; Jang, M.; Lee, M. Y.; Kweon, O. Y.; Oh, J. H., Flexible Field-Effect Transistor-Type Sensors Based on Conjugated Molecules. *Chem.* 2017, 3, 724-763.
4. Irimia-Vladu, M., "Green" electronics: biodegradable and biocompatible materials and devices for sustainable future. *Chem. Soc. Rev.* 2014, 43, 588-610.
5. Lin, P.; Yan, F., Organic Thin-Film Transistors for Chemical and Biological Sensing. *Adv. Mater.* 2012, 24, 34.
6. Elkington, D.; Cooling, N.; Belcher, W.; Dastoor, P. C.; Zhou, X., Organic Thin-Film Transistor (OTFT)-Based Sensors. *Electronics* 2014, 3, 234-254.
7. Lin, P.; Yan, F., Organic Thin-Film Transistors for Chemical and Biological Sensing. *Adv. Mater.* 2012, 24, 34-51.
8. Mulla, M. Y.; Tuccori, E.; Magliulo, M.; Lattanzi, G.; Palazzo, G.; Persaud, K.; Torsi, L., Capacitance-modulated transistor detects odorant binding protein chiral interactions. *Nat. Commun.* 2015, 6, 6010.
9. Palazzo, G.; De Tullio, D.; Magliulo, M.; Mallardi, A.; Intranuovo, F.; Mulla, M. Y.; Favia, P.; Vikholm-Lundin, I.; Torsi, L., Detection Beyond Debye's Length with an Electrolyte-Gated Organic Field-Effect Transistor. *Adv. Mater.* 2015, 27, 911-916.
10. Torsi, L.; Magliulo, M.; Manoli, K.; Palazzo, G., Organic field-effect transistor sensors: a tutorial review. *Chem. Soc. Rev.* 2013, 42, 8612-8628.
11. Tarabella, G.; Mahvash Mohammadi, F.; Coppede, N.; Barbero, F.; Iannotta, S.; Santato, C.; Cicoira, F., New opportunities for organic electronics and bioelectronics: ions in action. *Chem. Sci.* 2013, 4, 1395-1409.
12. Wang, Y.; Gong, Q.; Miao, Q., Structured and functionalized organic semiconductors for chemical and biological sensors based on organic field effect transistors. *Mater. Chem. Front.* 2020, 4 (12), 3505-3520.
13. Knopfmacher, O.; Hammock, M. L.; Appleton, A. L.; Schwartz, G.; Mei, J.; Lei, T.; Pei, J.; Bao, Z., Highly stable organic polymer field-effect transistor sensor for selective detection in the marine environment. *Nat. Commun.* 2014, 5, 2954.
14. Li, H.; Shi, W.; Song, J.; Jang, H.-J.; Dailey, J.; Yu, J.; Katz, H. E., Chemical and Biomolecule Sensing with Organic Field-Effect Transistors. *Chem. Rev.* 2019, 119, 3-35.
15. Langton, M. J.; Serpell, C. J.; Beer, P. D., Anion Recognition in Water: Recent Advances from a Supramolecular and Macromolecular Perspective. *Angew. Chem. Int. Ed.* 2016, 55, 1974-1987.
16. Hua, Y.; Flood, A. H., Click chemistry generates privileged CH hydrogen-bonding triazoles: the latest addition to anion supramolecular chemistry. *Chem. Soc. Rev.* 2010, 39, 1262-1271.
17. Zahran, E. M.; Fatila, E. M.; Chen, C.-H.; Flood, A. H.; Bachas, L. G., Cyanostar: C—H Hydrogen Bonding Neutral Carrier Scaffold for Anion-Selective Sensors. *Anal. Chem.* 2018, 90, 1925-1933.
18. Cai, J.; Sessler, J. L., Neutral CH and cationic CH donor groups as anion receptors. *Chem. Soc. Rev.* 2014, 43, 6198-6213.
19. Lee, S.; Chen, C.-H.; Flood, A. H., A pentagonal cyanostar macrocycle with cyanostilbene CH donors binds anions and forms dialkylphosphate [3]rotaxanes. *Nat. Chem.* 2013, 5, 704-710.

The invention claimed is:

1. A semiconductor sensor device for detecting an analyte, comprising
a semiconducting layer,
one or more organic molecules in the semiconducting layer comprising a π-conjugated polymer having at least 2 repeating units, and
one or more receptor molecules, comprising a polycyanostilbene macrocycle according to Formula I:

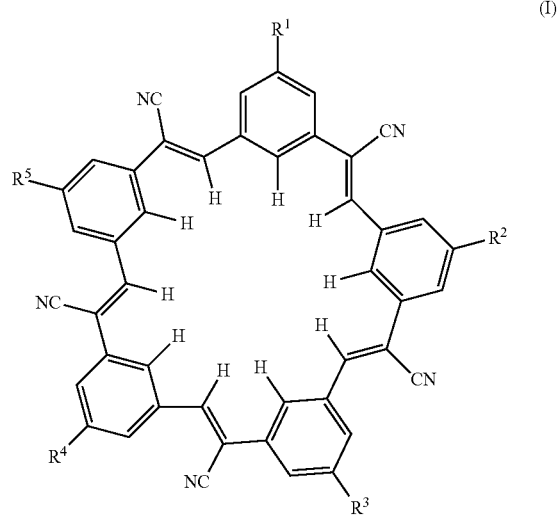

wherein $R^1$, $R^2$, $R^3$, $R^4$ and $R^5$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, —$(CH_2)_{1-20}$—NH—$(CH_2)_{1-20}$—$CH_3$, hydrogen, ethynyl, arylethynylene, -halo, —$OR^9$, —$N(R^{10}R^{11})$, —$CO_2R^{12}$, and —$C(O)$—$N(R^{13}R^{14})$, wherein $R^9$, $R^{10}$, $R^{11}$, $R^{12}$, $R^{13}$, and $R^{14}$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon and atoms, —$(CH_2)_{1-20}$—NH—$(CH_2)_{1-20}$—$CH_3$, and hydrogen, wherein the one or more receptor molecules are embedded within or onto the semiconducting layer of the semiconductor sensor device, wherein the semiconductor sensor device is stable in aqueous environments.

2. The semiconductor sensor device of claim 1, wherein the one or more organic molecules in the semiconducting layer further comprises small molecules having a number average molecular weight of from about 50 g/mol to about 5,000 g/mol, as measured by gel permeation chromatography and/or NMR.

3. The semiconductor sensor device of claim 1, wherein the π-conjugated polymer comprises repeat units (n)≥15, and having a molecular weight from about 15,000 g/mol to about 500,000 g/mol, as measured by gel permeation chromatography.

4. The semiconductor sensor device of claim 1, having a loading percentage of the one or more organic molecules to the one or more receptor molecules of from about 1 wt. % to about 50 wt. %.

5. The semiconductor sensor device of claim 1, wherein the $R^1$, $R^2$, $R^3$, $R^4$ and $R^5$ are each a tert-butyl group.

6. The semiconductor sensor device of claim 1, wherein the one or more organic molecules comprises poly[[2,5-bis(2-decyltetradecyl)-2,3,5,6-tetrahydro-3,6-dioxopyrrolo[3,4-c]pyrrole-1,4-diyl][2,2'-bithiophene]-5,5'-diyl-(1E)-1,2-ethenediyl[2,2'-bithiophene]-5,5'-diyl](PDVT).

7. The semiconductor sensor device of claim 1, wherein the π-conjugated polymer has a repeat unit according to Formula (II):

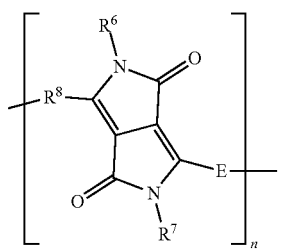

(II)

wherein E represents an "electron donating group", $R^6$ and $R^7$ are each independently selected from a hydrocarbyl group comprising from 1 to about 50 carbon atoms, $R^8$ may be a hydrocarbyl group comprising from 1 to about 20 carbon atoms, or a thiophene group, and n may be an integer of greater than 15.

8. The semiconductor sensor device of claim 1, further comprising a two-terminal chemresistor, comprising a source electrode and a drain electrode with a chemically sensitive semiconductor material comprising a channel.

9. The semiconductor sensor device of claim 1, further comprising a three-terminal transistor, comprising a source, a drain, and a gate electrode, configured to enhance an electrical conductivity of a chemically sensitive semiconductor material.

10. A method of preparing the semiconductor sensor device of claim 1, comprising a step of coupling the one or more receptor molecules into or onto the semiconducting layer of the semiconductor sensor device, a dielectric surface, or an electrode surface.

11. The method of claim 10, wherein the one or more organic molecules and the one or more receptor molecules are deposited via spin-coating, drop-casting, dip-coating, slot-die coating, doctor blading, or bar coating to form one or more of the semiconducting layers.

12. The method of claim 10, wherein the one or more organic molecules and the one or more receptor molecules are within the semiconducting layer of the semiconductor sensor device.

13. The method of claim 10, wherein the one or more receptor molecules are chemically incorporated into the one or more organic molecules via chemical reaction throughout the semiconducting layer of the semiconductor sensor device.

14. The method of claim 10, wherein the one or more receptor molecules are physically entrapped in the semiconducting layer.

15. A chemical sensor system for detecting analyte comprising a semiconductor sensor device including
one or more transistors each having a conductive channel including a semiconducting layer comprising
one or more organic molecules including a π-conjugated polymer having at least 2 repeating units, and
one or more receptor molecules comprising a polycyanostilbene macrocycle according to Formula (I):

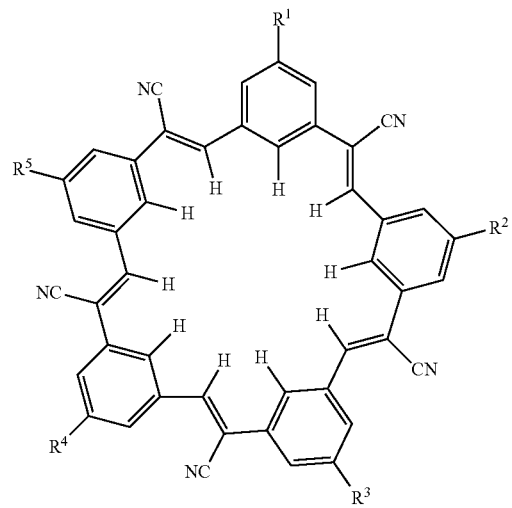

wherein $R^1$, $R^2$, $R^3$, $R^4$, and $R^5$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, $-(CH_2)_{1-20}-NH-(CH_2)_{1-20}-CH_3$, hydrogen, ethynyl, arylethynylene, -halo, $-OR^9$, $-N(R^{10}R^{11})$, $-CO_2R^{12}$, and $-C(O)-N(R^{13}R^{14})$, wherein $R^9$, $R^{10}$, $R^{11}$, $R^{12}$, $R^{13}$, and $R^{14}$ are each independently selected from the group consisting of an alkenyl group comprising from 2 to 20 carbon atoms, an alkyl group comprising from 2 to 20 carbon atoms, an alkoxy group comprising from 2 to 20 carbon atoms, an aryl group comprising from 6 to 20 carbon atoms, a cycloalkyl group comprising from 4 to about 20 carbon atoms, a heteroaryl group comprising from 5 to 20 carbon atoms, a heterocyclic group comprising from 3 to about 20 carbon atoms, a haloalkyl group comprising from 1 to 20 carbon atoms, $-(CH_2)_{1-20}-NH-(CH_2)_{1-20}-CH_3$, and hydrogen, wherein the one or more receptor molecules is embedded within or located on a surface of the semiconducting layer of the semiconductor sensor device, a sample configured to hold a target molecule and the target molecule has a selective affinity to bind with the one or more receptor molecules, an assay system configured to bring the semiconductor sensor device in contact with the sample, a digital read-out, and a data processing system.

16. The chemical sensor system of claim 15, wherein the system comprises two or more of the semiconductor sensor devices.

17. The chemical sensor system of claim 15, wherein the system is configured to operate through a chemical doping of the semiconducting layer upon interaction with the analyte, wherein the semiconducting layer comprises the one or more receptor molecules.

18. The chemical sensor system of claim 15, wherein the system is configured to operate through a chemical dedoping of an active layer upon interaction with the analyte, wherein the active layer comprises the one or more receptor molecules.

19. The chemical sensor system of claim 15, wherein the system is configured to detect a single analyte.

20. The chemical sensor system of claim 15, wherein the system is configured to detect multiple analytes of different chemical identities and classifications.

* * * * *